(12) United States Patent
Piyasinghe et al.

(10) Patent No.: US 10,942,209 B2
(45) Date of Patent: Mar. 9, 2021

(54) FLOATING NEUTRAL DETECTION AND LOCALIZATION SYSTEM AND METHODS

(71) Applicant: ACLARA TECHNOLOGIES, LLC, St. Louis, MO (US)

(72) Inventors: Lakshan Piyasinghe, St. Louis, MO (US); David W. Rieken, St. Louis, MO (US)

(73) Assignee: Aclara Technologies LLC, St. Louis, MO (US)

( * ) Notice: Subject to any disclaimer, the term of this patent is extended or adjusted under 35 U.S.C. 154(b) by 296 days.

(21) Appl. No.: 15/951,099

(22) Filed: Apr. 11, 2018

(65) Prior Publication Data

US 2018/0292447 A1    Oct. 11, 2018

Related U.S. Application Data

(63) Continuation-in-part of application No. 15/219,775, filed on Jul. 26, 2016, now Pat. No. 10,401,402.

(60) Provisional application No. 62/484,313, filed on Apr. 11, 2017.

(51) Int. Cl.
   *G01R 31/08*   (2020.01)
   *G01R 19/25*   (2006.01)
   *G01R 21/133*  (2006.01)

(52) U.S. Cl.
   CPC ....... *G01R 31/088* (2013.01); *G01R 19/2513* (2013.01); *G01R 21/133* (2013.01); *G01R 31/086* (2013.01)

(58) Field of Classification Search
   CPC .................................................. G01R 31/088
   See application file for complete search history.

(56) References Cited

U.S. PATENT DOCUMENTS

2009/0024356 A1*  1/2009  Platt ....................... G16H 50/20
                                                        702/181
2009/0240644 A1*  9/2009  Boettcher ............. H04L 41/142
                                                        706/47
2017/0102984 A1*  4/2017  Jiang .................... G05B 23/024

* cited by examiner

*Primary Examiner* — Hyun D Park
(74) *Attorney, Agent, or Firm* — Michael Best & Friedrich, LLP

(57) ABSTRACT

The present disclosure pertains to novel systems and methods that incorporate advanced inference algorithms can be developed to detect floating neutrals using phasor measurements. In one aspect, the present disclosure relates to the use of phasor measurements to detect and localize floating neutrals in a distributed power network.

8 Claims, 27 Drawing Sheets

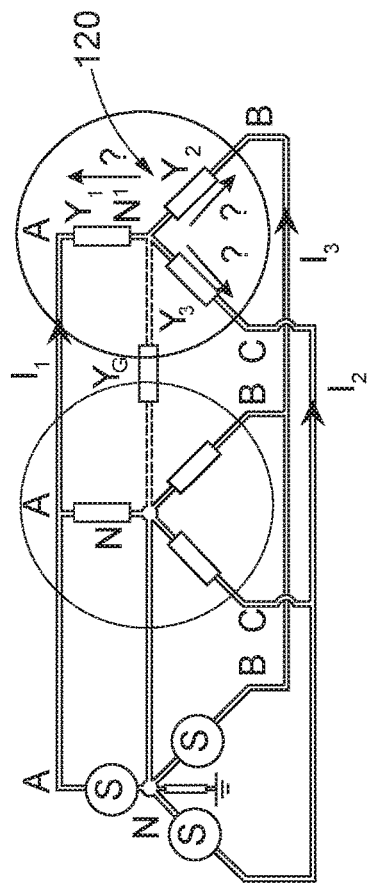
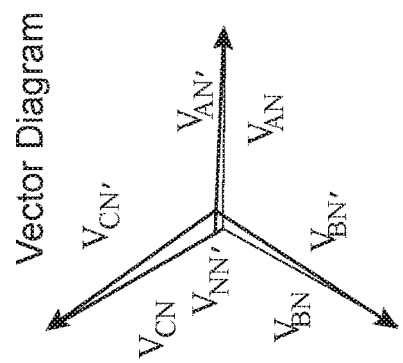
FIG. 17

Voltages of All the Nodes can be Caluclated Using Power Flow Equations.

Network admittance matrix $$Y_{ki} = G_{ki} + jB_{ki}$$

Bus k $V_k \angle \theta_k$ $S_k = P_k + jQ_k$ $k = 1, N$
$N$ - Number of Nodes
$\theta_{ki} = \theta_k - \theta_i$ Single Phase Power Equations $$P_k = \sum_{i=1}^{N} V_k V_i [G_{ki} cos\theta_{ki} + B_{ki} sin\theta_{ki}]$$

$$Q_k = \sum_{i=1}^{N} V_k V_i [G_{ki} sin\theta_{ki} - B_{ki} cos\theta_{ki}]$$

FIG. 18

FLOATING NEUTRAL DETECTION AND LOCALIZATION SYSTEM AND METHODS

RELATED APPLICATIONS

The present application claims priority to U.S. Provisional Application Ser. No. 62/484,313, entitled "Floating Neutral Detection and Localization from Synchrophasor Measurements," filed on Apr. 11, 2017. The present application claims priority to and is a continuation-in part to U.S. patent application Ser. No. 15/219,775, entitled "Synchronized phasor measurement in power distribution networks," filed on Jul. 26, 2016. The present application is also related to PCT International Patent Application Serial No. PCT/US2017/043612, entitled "Synchronized phasor measurement in power distribution networks," filed on Jul. 25, 2017 and U.S. patent application Ser. No. 15/088,971, entitled "Framework for fault detection and localization in power distribution networks," filed on Apr. 1, 2016. Each of the aforementioned applications is incorporated herein by reference in its entirety.

BACKGROUND

Electric power is generally transmitted from generation plants to end consumers (industries, commercial, residential, etc.) via a transmission and distribution grid consisting of a network of power stations and substations interconnected by transmission circuits/power lines. From the transmission grid, power may then be distributed to end consumers via a distribution system.

Floating neutral faults create potentially dangerous situations and power quality problems in distribution power grids. These faults are difficult to detect with existing low cost sensors and present a difficult problem for utility companies. In particular, these faults create potentially dangerous situations and decrease efficiency. Additionally, floating neutral faults may give rise to power quality problems at affected sites. As such, robust and reliable means for detecting floating neutral faults using measurements from existing equipment typically used on existing power grids is desirable.

SUMMARY

The present disclosure pertains to novel systems and methods that incorporate advanced inference algorithms can be developed to detect floating neutrals using phasor measurements. In one embodiment, the present disclosure relates to using phasor measurements to detect and localize floating neutrals on the medium voltage (MV) (e.g.; 2 kV to 35 kV) side of a power distribution network.

In another aspect, a processing system executes one or more algorithms to process information obtained from waveforms which are monitored at portions of the grid, including but not limited to a power distribution substation. The waveforms may indicate a floating neutral fault in the distribution power grid.

The system may execute or be used to execute a plurality of methods for detecting floating neutral faults. In one embodiment the method may detect floating neutrals using statistical classifications. In another embodiment the method may detect floating neutrals using a message passing algorithm. In another embodiment the method may detect floating neutrals using a voltage based classification. The methods described herein may also be performed in accordance with instructions stored in a non-transitory computer-readable storage medium. The instructions may be executed by a processor of a computing or processing device.

In one embodiment a method for detecting floating neutral faults may be performed using a floating neutral detection and localization system a phase synchronizer and a computing device with memory and processor. The method includes, at the processor, polling a first node in the distributed power network for first phasor data and determining if the first node is a branch point. If the first node is not a branch point, the method includes polling a second node for second phasor data, wherein the second node is a sequential to the first node. If the first node is a branch point, then the method further includes grouping child nodes of the first node into at least two child groups and calculating a Kullback-Leibler distance for each phase within each of the child groups. A total distance value is assigned to each of the child groups. The method also includes determining if each node in the distributed power network has been polled for phasor data. If any other node in the distributed power network has not been polled, then a next sequential node is polled. Conversely, if all nodes have been polled, the method further includes classifying each edge as being in a healthy condition or a fault condition based on a total Kullback-Leibler distance.

In another embodiment, the floating neutral algorithm includes detecting floating neutral faults using voltage based classification. A method includes, at a processor, selecting a starting node, acquiring a phasor measurements for the starting node, and estimating voltages for intermediate nodes. The method also includes calculating a Euclidean distance between node voltages, assigning the Euclidean distance value to an appropriate edge between the nodes, and classifying each node as being in a healthy condition or a fault condition based on the assigned Euclidean distance values.

In one embodiment, the floating neutral algorithm includes detecting floating neutral faults using a message passing process, the method further includes, at a processor, generating a factor graph of a node network using Bayesian factorization and calculating voltage values for each node based on a parent voltage and an edge state of each node. The method also includes calculating a probabilistic edge state for each branch of the node network, and distributing phasor measurements to each node according to node voltage states.

BRIEF DESCRIPTION OF THE DRAWINGS

The drawings represent various features, components, and embodiments of the systems and methods disclosed.

FIG. 17 is a node diagram and example formulas used to calculate voltages at affected nodes in accordance with one embodiment of the floating neutral detection and localization system.

FIG. 18 is a listing of power flow equations used to calculate voltages at all nodes in accordance with one embodiment of the floating neutral detection and localization system.

Corresponding reference characters indicate corresponding parts throughout the drawings.

DETAILED DESCRIPTION

Figure 1:
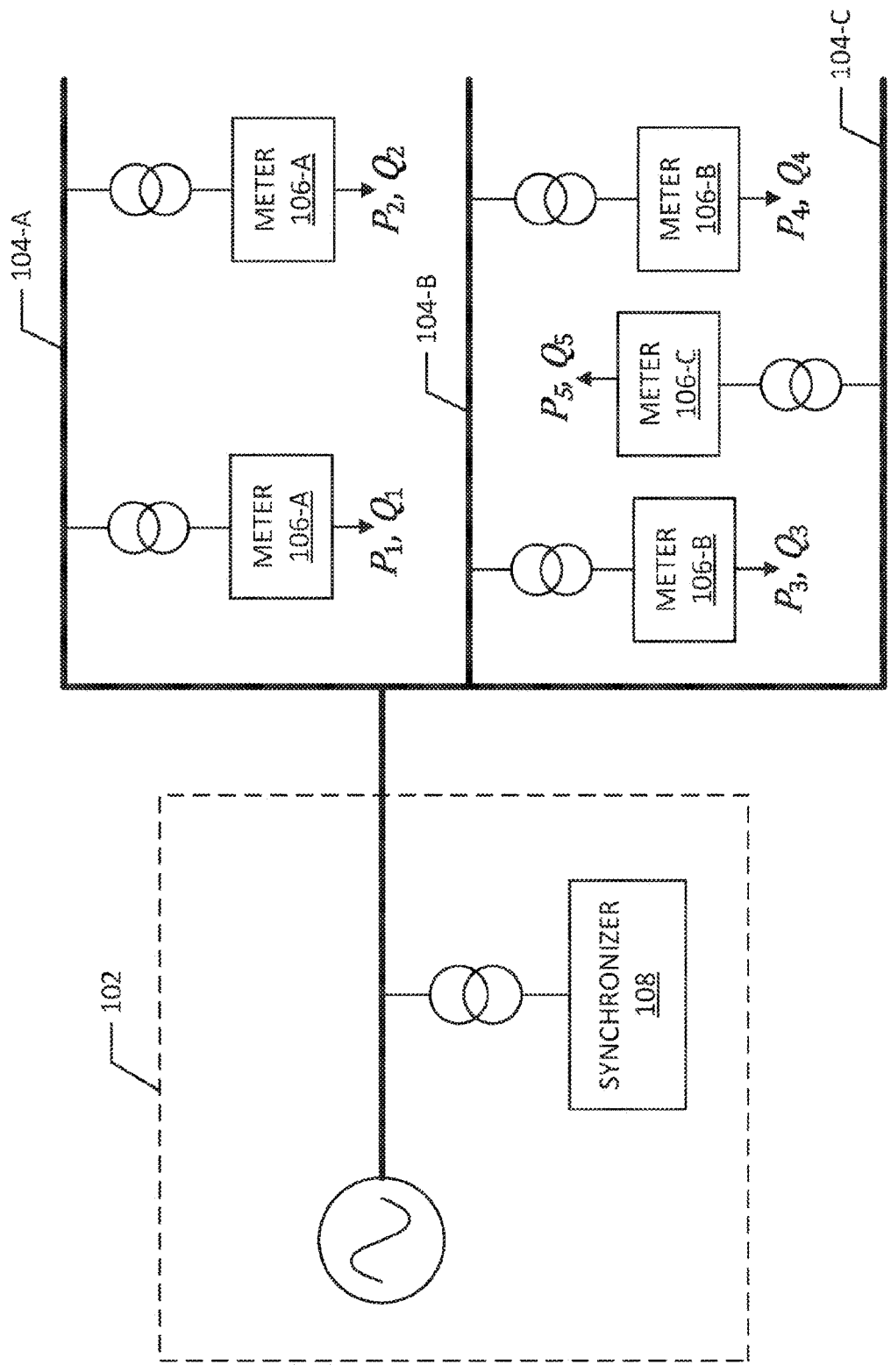
FIG. 1 is a block diagram illustrating one embodiment of an exemplary phasor measurement system for implementing the described invention.

The present disclosure generally relates systems and methods that incorporate advanced inference algorithms to detect floating neutrals using phasor measurements. In various embodiments, one or more utility meters in a power distribution network will have the disclosed system installed to measures voltage and current phasors synchronously across the entire network. These phasors may be transmitted to a central location and fed to an inference engine to detect and locate floating neutrals.

Various utility meters may be equipped with a Phasor Measurement Unit (PMU) that measure the electrical waves on an electricity grid using a common time source for synchronization and using phase angle as a relative quantity. It is generally necessary when combining phasors taken from different parts of a power grid to align the phase angle elements to a common phase reference; this is typically done in PMUs through the use of GPS timing signals. Such phasors are known as synchrophasors.

The one or more meters in a distribution network may have devices capable of phasor measurements. In some embodiments, phasor measurements may be obtained using a PMU. In other embodiments, measurements may be obtained using other types of PMUs. One of skill in the art will appreciate that any type of device which measures the electrical waves on an electricity grid using a common time source for synchronization may be utilized.

In one embodiment, a system for detecting floating neutral may include a processing device having a processor and memory; and one or more PMUs which may be located at power substations or end consumer meters. The PMUs provide positive sequence voltage and current phasor measurements to the computer, and the computer calculates complex power having a real component and an imaginary component, using said positive sequence voltage and current phasor measurements; and uses the real component of the complex power as a calculated mega-watt and the imaginary component of the complex power as a calculated mega volt-ampere; and uses the calculated mega-watt and calculated mega volt-ampere calculations in a state estimation algorithm.

The system may include a plurality of methods for detecting floating neutral faults. In one embodiment the method may detect floating neutrals using statistical classifications. In another embodiment the method may detect floating neutrals using a message passing algorithm. In another embodiment the method may detect floating neutrals using a voltage based classification.

The described systems communicate across various portions of a power distribution network for transmitting and receiving data. The described system and methods quantify the phase angle between voltage and current phasor measurements at a point or between any two points in the power distribution network and does not require GPS or other external clock reference for time synchronization. For example, the system measures the phase of the mains voltage at any capable metering device relative to a mains voltage of its parent substation. The system also measures the current phasor synchronously with the voltage phasor at any capable metering device, and thus synchronously with the voltage phasor of the parent substation. In one form, the system is implemented in embedded firmware at metering points and utilizes one very low frequency (VLF)-band and/or ultra-low frequency (ULF)-band transmitter at each substation on the power distribution network.

FIG. 1 illustrates an exemplary synchronized phasor (i.e., synchrophasor) measurement system, generally indicated at 100, in accordance with an embodiment of the invention. The synchronized phasor measurement system 100 includes a substation 102, a power distribution network 104, and metering devices 106. The substation 102 includes a synchronizer device 108. The metering devices 106 are mechanically, electrically, and/or communicatively connected to aspects of the power distribution network 104. As illustrated in FIG. 1, the metering devices 106 may be connected to transformers (e.g., distribution transformers that step down medium voltage to low voltage). The synchronizer device 108 is also mechanically, electrically, and/or communicatively connected to aspects of the power distribution network 104, as further described herein. The synchronizer device 108 may be connected to the network 104 by a transformer, as shown in FIG. 1. In one form the synchronizer device 108 is electrically and/or communicatively coupled to the metering devices 106 via the electric distribution network 104. In another form, aspects of system 100 (e.g., network 104, metering devices 106, synchronizer device 108, etc.) comprise a power-line communication (PLC) system. The rate at which the system 100 is capable of measuring phasors depends on the data rate of the PLC system. In an embodiment, the PLC system has a downlink data rate of 10 to 100 bits per second (bps), which results in an interval rate of about 1 to 10 seconds.

In an embodiment, the power distribution network 104 comprises distribution lines each adapted to carry electric power having different wiring phases. For example, a distribution line 104-A may be adapted to carry electric power having Phase A to metering devices 106-A, a distribution line 104-B may be adapted carry electric power having Phase B to metering devices 106-B, and a distribution line 104-C may be adapted carry electric power having Phase C to metering devices 106-C. In an embodiment, distribution lines of the power distribution network 104 may carry electric power having a combination of Phase A, Phase B, and/or Phase C. For example, when the system includes delta-Y and/or Y-delta transformers the phases of the outputs of these transformers will not be pure Phase A, Phase B, or Phase C, but instead may be a combination of Phase A, Phase B, and/or Phase C. In one form, system 100 utilizes PLC to provide synchronized phasor measurements ubiquitously throughout the power distribution network 104.

The metering devices 106 are placed on the power distribution network 104 wherever synchronous phasor measurements are to be made. The metering devices 106 are capable of digitally receiving (e.g., sampling) VLF-band and/or ULF-band PLC signals, storing firmware and measured phasors on a memory device, and executing the firmware in real-time or near real-time with one or more processors to estimate local phasors relative to the substation phasor, as further described herein. VLF-band PLC signals include those in the range of about 3 kHz to about 30 kHz and ULF-band PLC signals include those in the range of about 0.3 kHz to about 3 kHz. In one form, aspects of the synchronized phasor measurement system 100 utilize PLC signals having a frequency of at least about 1 kHz. The metering devices 106 are incorporated into an advanced metering infrastructure (AMI) system. In one form, metering devices 106 retrieve VLF-band and/or ULF-band signals from baseband mains sampled signals. As shown in FIG. 1, the metering devices 106 are capable of determining active power (P) and reactive power (Q).

The synchronizer device 108, which may be placed at every substation 102 on a three-phase point, is capable of transmitting a VLF-band and/or ULF-band PLC signal on each phase of the network 104. In one form, the synchronizer device 108 is adapted to generate a beacon that will penetrate the power distribution network 104 providing time-reference information and substation 102 phasor information, as further described herein.

In one form, the system 100 is utilized for real-time operations applications such as wide-area situational awareness (e.g., power factor monitoring, voltage or current monitoring and trending, etc.), diagnosing system voltage imbalance, event detection and avoidance (e.g., floating neutral detection, fault detection, etc.), alarming and setting system operating limits, state estimation, outage detection and restoration, real-time operations planning, and the like. By monitoring power factor and voltage distribution across power distribution network 104 via system 100, optimal placement and setting for devices such as capacitor banks and voltage regulators may be determined. Aspects of system 100 may also provide synchrophasor measurements for calculating voltage unbalance factors which can be utilized to analyze imbalance conditions across the power distribution network 104. Exemplary synchrophasors include measurements of values on the power distribution network 104 (e.g., power, voltage, current, etc.) time-stamped according to a common time reference.

Figure 2:
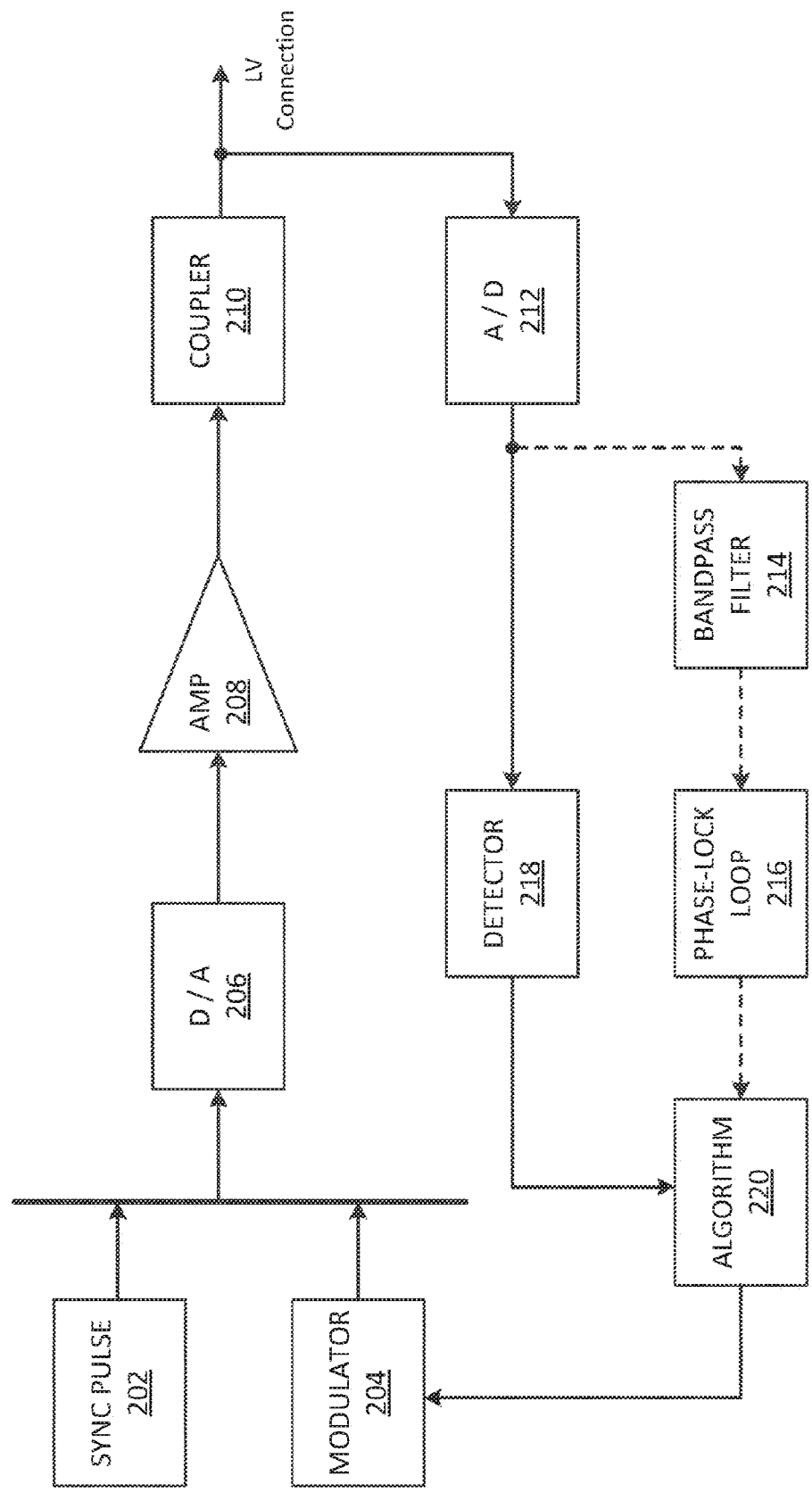
FIG. 2 is a block diagram illustrating one embodiment of an exemplary signal processing chain of the synchronizer of FIG. 1.

FIG. 2 illustrates an exemplary signal processing chain synchronizer device 108 in accordance with an aspect of the invention. In accordance with FIG. 2, synchronizer device 108 generates a beacon that penetrates the network 104 providing time-reference information and substation phasor information. The illustrated signal processing chain includes a synchronization pulse generator 202, a modulator 204, a digital-to-analog (D/A) converter 206, an amplifier 208, a coupler 210, an A/D converter 212, a bandpass filter 214, a phase-locked loop (PLL) 216, a detector 218, and an algorithm 220 stored as processor-readable instructions in a non-transitory, tangible medium such as a memory device and executed by one or more processors.

The synchronization pulse generator 202 is adapted to generate a synchronization pulse for establishing a common time reference between synchronization device 108 and metering devices 106, as further described herein. The modulator 204 is adapted to generate a communications signal encoded with information pertinent for establishing phase references at remote metering devices 106 relative to the synchronization device 108, as further described herein. In one form, the synchronization pulse (e.g., signal) and the communications signal are combined into a communications package. The D/A converter 206 is adapted to convert the communications package from a digital representation of a quantity (e.g. an amplitude) to a continuous physical quantity (e.g. a voltage). The amplifier 208 is adapted to amplify the analog communications package before transmission across the network 104.

The coupler 210 is adapted to connect the synchronization device 108 to the network 104, block high-voltage mains signals from the rest of the device, and allow the generated analog signals to pass unobstructed onto the power lines of network 104. In one form, the coupler 210 connects the synchronization device 108 to the network 104 by a low voltage (LV) connection. Additionally or alternatively, the coupler 210 comprises a three-phase connection point for the synchronization device 108.

The A/D converter 212 is adapted to sample the mains voltage at the connection point. In an embodiment, the A/D converter 212 is adapted to sample the waveform, from which the voltage magnitude and phase are derived. As shown in FIG. 2, the signal produced by the A/D converter 212 is sent to the detector 218. In an additional or alternative embodiment, the signal produced by the A/D converter 212 is sent to the PLL 216 via a bandpass filter 214, as further described herein. In one form, the need for sending the signal produced by the A/D converter 212 to the PLL 216 via the bandpass filter 214 is governed by the signal-to-noise ratio (SNR) of the 60 Hz sinewave. For example, in high-SNR situations (e.g., where the waveform is affected minimally by noise and/or distortion, etc.) the phase angle of the signal is inferred from zero-crossings of the raw waveform, and in low-SNR situations (e.g., where the waveform is corrupted by noise and/or distortion, etc.) PLL 216 is used to generate a faithful representation of the fundamental component of the waveform and the phase angle of the signal is inferred from zero-crossings of that representation instead of the raw waveform. The detector 218 is adapted to analyze the power line waveform to detect a synchronization pulse, if ever one is present. The PLL 216 is adapted to track the phase of the mains voltage. In an additional or alternative embodiment, the PLL 216 is adapted to track the amplitude of the mains voltage. An exemplary PLL 216 includes a phase detector, a loop filter, a voltage controlled oscillator (VCO), and a frequency divider. In an exemplary system, the divisor of the frequency divider equals one such that the output frequency equals the input frequency (i.e., the divider function is not utilized). When the algorithm 220 detects a sync signal, the time of detection, phase, and magnitude of the power line voltage and current are stored on a memory device and sent to the modulator 204 for transmission in the next beacon. Additional details regarding algorithm 220 are described herein.

Figure 3:
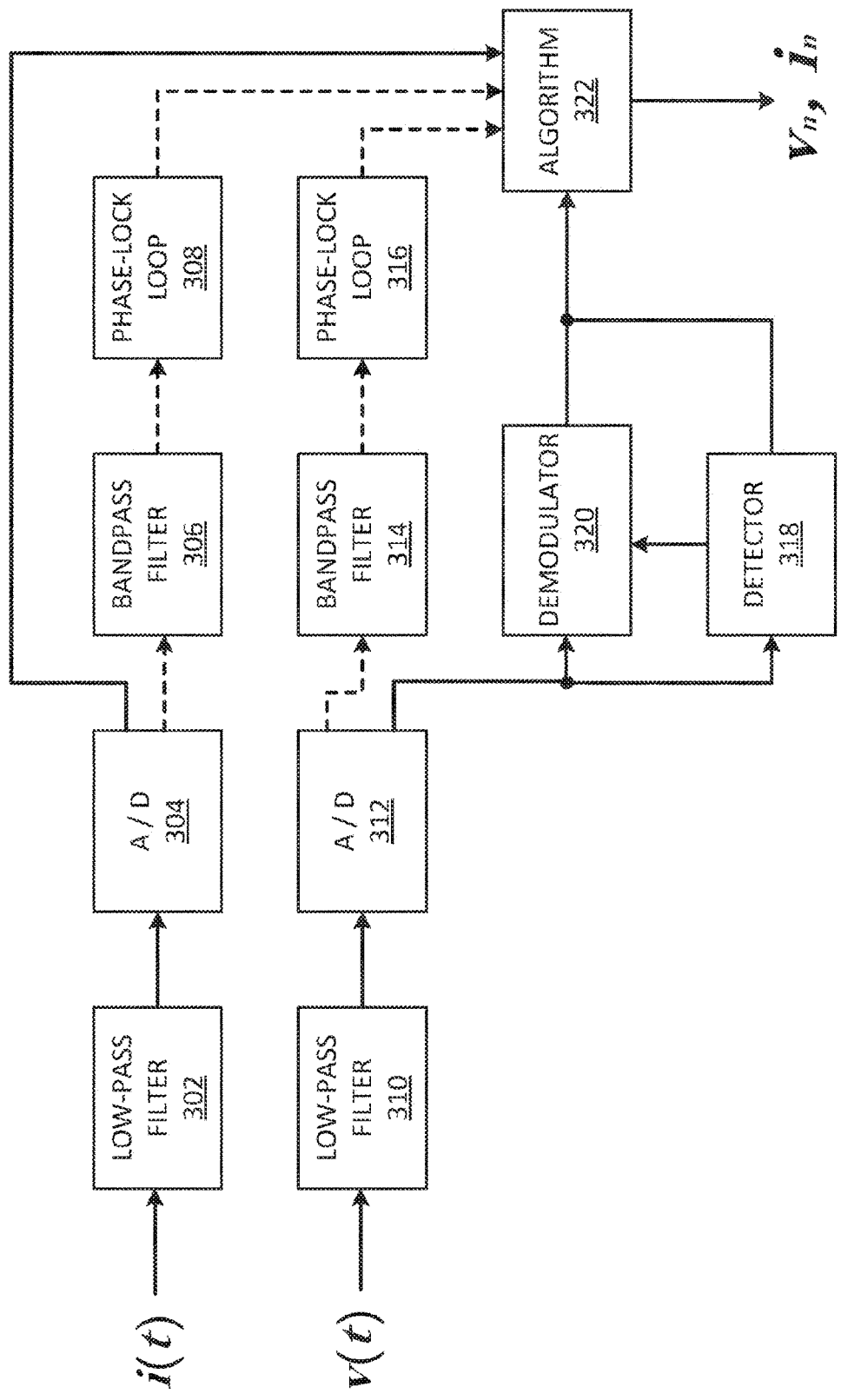
FIG. 3 is a block diagram illustrating one embodiment of an exemplary signal processing chain of the meters of FIG. 1.

FIG. 3 illustrates an exemplary signal processing chain metering device 106 in accordance with an aspect of the invention. In accordance with FIG. 3, metering devices 106 sample the voltage and current observed at the meter point and operate on it with a PLL. The illustrated signal processing chain includes a low-pass filter 302 for the current, an A/D converter 304 for the current, a bandpass filter 306 for the current, a PLL 308 for the current, a low-pass filter 310 for the voltage, an A/D converter 312 for the voltage, a bandpass filter 314 for the voltage, a PLL 316 for the voltage, a detector 318, a demodulator 320, and an algorithm 322 stored as processor-readable instructions in a non-transitory, tangible medium such as a memory device and executed by a processor. In one form, the exemplary signal processing chain illustrated by FIG. 3 is provided by metering devices 106 having filters 302, 310 and A/D converters 304, 312 capable of satisfying the Nyquist criterion for the beacon and an adequate memory device and one or more processors.

The low-pass filters 302 and 310 are antialiasing filters configured as appropriate for the sampling rates of A/D converters 304, 312, respectively. The A/D converter 304 is adapted to convert the filtered current signals passed by low-pass filter 302 from the continuous current quantity to a digital representation of the amplitude of the quantity. Similarly, the A/D converter 312 is adapted to convert the filtered voltage signals passed by low-pass filter 310 from the continuous voltage quantity to a digital representation of the amplitude of the quantity. The sampled current signal produced by A/D converter 304 has the magnitude and phase for the current to be derived therefrom via algorithm 322. The sampled voltage signal produced by A/D converter 312 is sent to the detector 318 which, when it detects a synchronization pulse, causes the magnitude and phase for the voltage to be derived therefrom via algorithm 322. Optionally, the digital signals produced by A/D converters 304 and 312 are sent to PLLs 308 and 316, respectively, via bandpass filters 306 and 314, respectively. The demodulator 320 demodulates the communications package received from the synchronizer device 108, which contains the phase and magnitude of the synchronizer device 108 voltage phasor, the time stamp, and the index, at the time of a previous synchronization pulse as further described herein.

Figure 4:
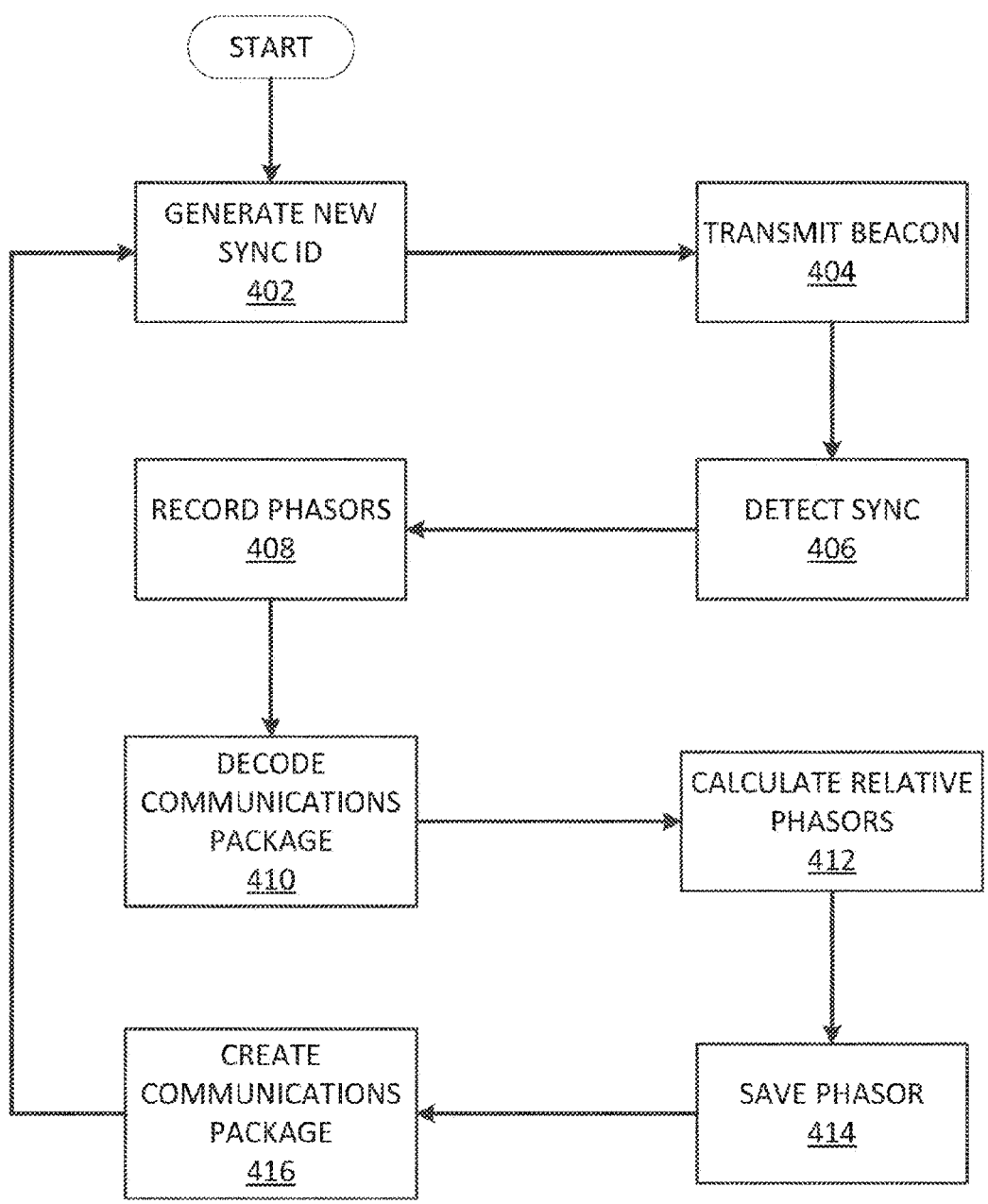
FIG. 4 is a diagram illustrating one embodiment of an exemplary operation of the phasor measurement system of FIG. 1.

FIG. 4 illustrates an exemplary method of operation of the phasor measurement system 100. At step 402, the synchronizer device 108 generates a new synchronization (sync) ID and adds it to the communications package. The purpose of the sync ID is to identify each beacon that the synchronizer device 108 transmits, which allows the metering devices 106 to associate phasor measurements locally with remote phasor measurements. At step 404, the synchronizer device 108 transmits a beacon across the network 104 which consists of a synchronization signal, s(t), generated by the synchronization pulse generator 202 followed by the communications package.

At step 406, matched filters at the synchronizer device 108 (e.g., detector 218) and each of the metering devices 106 (e.g., detector 318) simultaneously, or substantially simultaneously, detect the synchronization signal of the beacon transmitted at step 404. It is contemplated that some devices may not detect the signal. In one form, the devices do not need to detect the signal precisely, as further described herein. The synchronizer device 108 and each of the metering devices 106 marks the voltage and current phasors, during step 408, at the time of the detection at step 406. The recorded voltage and current phasors are provided by the output of the PLLs of each metering device 106.

At step 410, each metering device 106 decodes the communications package. The presence of a communications package is indicated by the detection of the synchronization signal (e.g., step 406). Included in the communications package are phasor measurements at the synchronizer device 108 for the previous beacon. The sync ID of the syncs measured and included in this package is also included so that the correct association can be made. During step 412, each of the metering devices 106 calculates relative phasors by subtracting local phasors from the reference phasor at the synchronizer device 108. In one form, the reference phasors are one iteration old because the communications package includes data from the previous sync and not the current sync. In other forms, the reference phasors may be more than one iteration old or may contain data from the current sync (i.e., the data is zero iterations old). By examining detection times remotely (e.g., at the synchronizer device 108) and locally (e.g., at the metering device 106), differences in the clock rate and clock drift between the meter clock and the synchronizer clock can be inferred. Improved phasor resolution is possible by correcting for the clock drift in accordance with an aspect of the invention, as further described herein.

At step 414, the synchronizer device 108 marks the voltage phasor at its own location at the time of this detection. The synchronizer device 108 also marks the time at which the detection was made. These fields are left blank when the synchronizer device 108 fails detect a sync signal during an iteration. At step 416, the synchronizer device 108 creates a new communications package consisting of the detected sync ID, the recorded voltage phasor, and the timestamp from step 414 before returning to step 402.

In one form, the purpose of the synchronization signal, s(t), is to provide a temporal reference for phasor extraction. Additionally or alternatively, the synchronization signal may also be used by the communications system to signal the beginning of a communications package. The signal received by the metering devices 106 is of the form $$r(t)=h(t)*s(t-\tau)+n_p(t)+n_c(t) \quad (1)$$

where h(t) is the transfer function of the channel between the synchronizer device 108 and the metering device 106. As used herein, a * symbol denotes convolution if used as an operation and complex conjugation if used as a superscript. Additive noise is decomposed into periodic noise, $n_p(t)$, and cyclostationary noise, $n_c(t)$, where $E[|n_p(t)|^2] \gg E[|n_c(t)|^2]$. The transmitted synchronization signal contains an unknown delay, T, which synchronization requires to be estimated. If $$s(t)=\Sigma_{n=0}^{N-1}s_n g(t-nT) \quad (2)$$

where T is the mains period and $s_n \in \mathbb{C}$ satisfy $$\Sigma_{n=0}^{N-1}s_n=0 \quad (3)$$

then the matched detectors 218, 318 are configured to cancel out the periodic noise $n_p(t)$ leaving only the cyclostationary noise $n_c(t)$.

The detection time is given as $$\hat{\tau} = \mathrm{argmax}\, r(t)*s^*(-t) \quad (4)$$
$$= \mathrm{argmax}\, h(t)*s(t-\tau)*s^*(-t)+n_c(t)*s^*(-t)$$
$$= \mathrm{argmax}\, h(t)*R_s(t-\tau)+n_c*s^*(t-\tau)$$

where $$R_s(t)=s(t)*s^*(-t). \quad (5)$$

The Fourier transform of $R_s(t)$ is therefore $\mathcal{F}[R_s(t)]=|S(f)|^2$ where S(f) is the Fourier transform of s(t). Since the only source of error in (4) is the second term, the choice of s(t) affects the precision of $\hat{\tau}$. If s(t) lies within the passband of the channel and the gain of that channel is referred to as A, then (7) becomes $$\hat{\tau}=\mathrm{arg\,max}\, AR_s(t-\tau)+n_c(t)*s^*(t-\tau). \quad (6)$$

Thus, the variance of $\hat{\tau}$ decreases with increasing $AR_s(0)$ and with decreasing $E[|n_c(t)|^2]$. Moreover, the width of the mainlobe of the synchronization signal in $R_s(t)$ directly impacts the estimate of the arrival time. Accordingly, a narrower mainlobe results in better precision. For most signals of interest, the mainlobe can only be narrowed by increasing the signal bandwidth. In one form, the variance of $\hat{\tau}$ is improved by increasing its duration and thus its energy. In another form, the variance of $\hat{\tau}$ is improved by increasing its bandwidth.

When the channel transfer function, h(t), is such that $$|s(t)*h(t)|^2 < E[|n_c(t)*s(t)|^2] \quad (7)$$

then the estimate of the arrival time will be very poor. This indicates a channel incapable of propagating the synchronization signal. Signals occupying the spectrum beneath 10 kHz propagate long distances on the power line and thus are well suited for this problem.

The synchronization signal is followed by a communications signal which contains a unique identifier for the beacon to which it is attached. The communications signal also contains information about the phasor extraction at the synchronizer device 108 during a previous beacon. A PLC system in accordance with aspects of the invention is capable of penetrating the electric distribution network 104 and operating in a band (e.g., at least 1 kHz) that is low enough to allow coupling of a digital waveform generator to the LV powerline by means of a linear coupling device (e.g., coupler 210). Exemplary communications systems include the TWACS Gen-V communication system and/or other CDMA-OFDM systems with 4-QAM modulation. In one form the communication system uses a (255,99) BCH code to encode one complete downlink frame over 14 chips with a length 32 spreading code and a downlink data rate of 99/(14×33×1/60)=12.86 bps.

In another form, aspects of the invention include a communications modulator that does not use a digital waveform generator. For example, a TWACS communications system may accomplish signal generation by a switched-load method. The time-of-arrival problem is restated by modifying (1) as $$r(t)=h(t)*s(t-\tau;\theta)+n_p(t)+n_c(t) \quad (8)$$

where θ is a nuisance parameter representing the unknown qualities of the TWACS signal for the given transmission. The time-of-arrival estimator estimates these parameters in order to obtain the estimate of τ. Since multiple beacons are transmitted, the receiver tracks these parameters and refines its estimate, and therefore its time estimate, as each beacon arrives. Combining this with the appropriate synchronization algorithm and the time estimate results in phasor measurements. In one form, the communication system includes a digital receiver, has a downlink data rate of about 30 bps, and includes a preamble to serve as the synchronization signal, s(t). In an embodiment in which communications system modems have A/D converters attached to the LV mains, synchrophasor measurement in accordance with aspects of the invention may be implemented as a downloadable firmware update.

Figure 5:
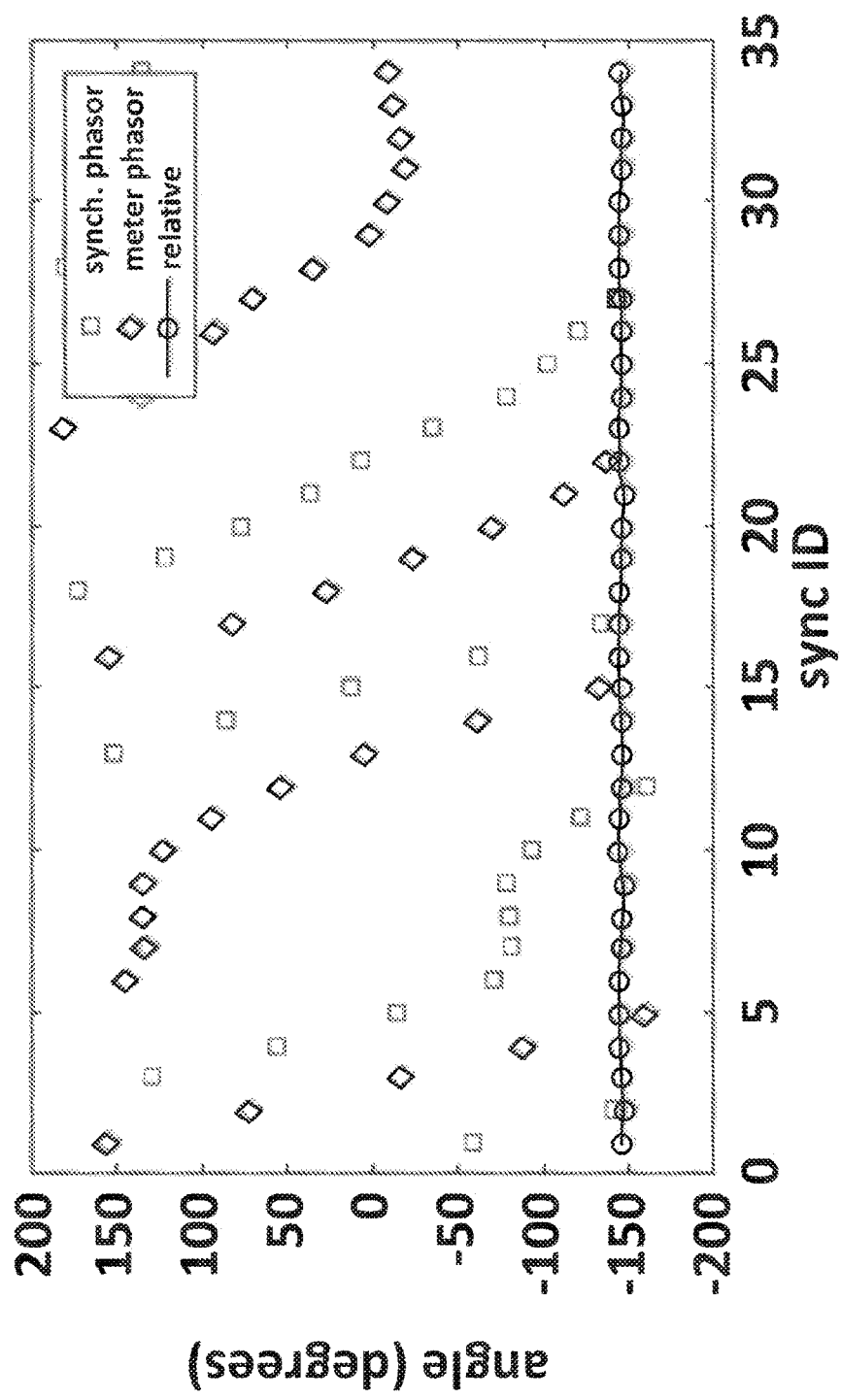
FIG. 5 is a graph illustrating one embodiment of exemplary phasor calculations of the phasor measurement system of FIG. 1.

FIG. 5 illustrates exemplary phasor calculations of the phasor measurement system 100 in which the synchronizer device 108 and the metering device 106 are operating on different wiring phases. With each beacon, the phasors at both the synchronizer device 108 and the metering device 106 are being sampled at irregular intervals, so that the phase angle of each appears random, as illustrated by the squares (phasor for synchronizer device 108) and the diamonds (phasor for metering device 106). As illustrated by the circles and the line, the angle between the phasors, the relative phase angle, is nearly constant. The standard deviation of the phase angle measured in this way is 0.9961°. As described herein, powerline noise introduces error to the time-of-arrival estimate at both the synchronizer device 108 and at the metering device 106. Thus the synchronizer voltage and meter voltage phasors are sampled at slightly different times. These errors are statistically independent. Having the detection time at both locations makes it possible to correct the phasor angle to account for the difference in detection times. For example, this may be accomplished by translating time at the meter to time at the concentrator, such as by synchronizing distant clocks.

Figure 6:
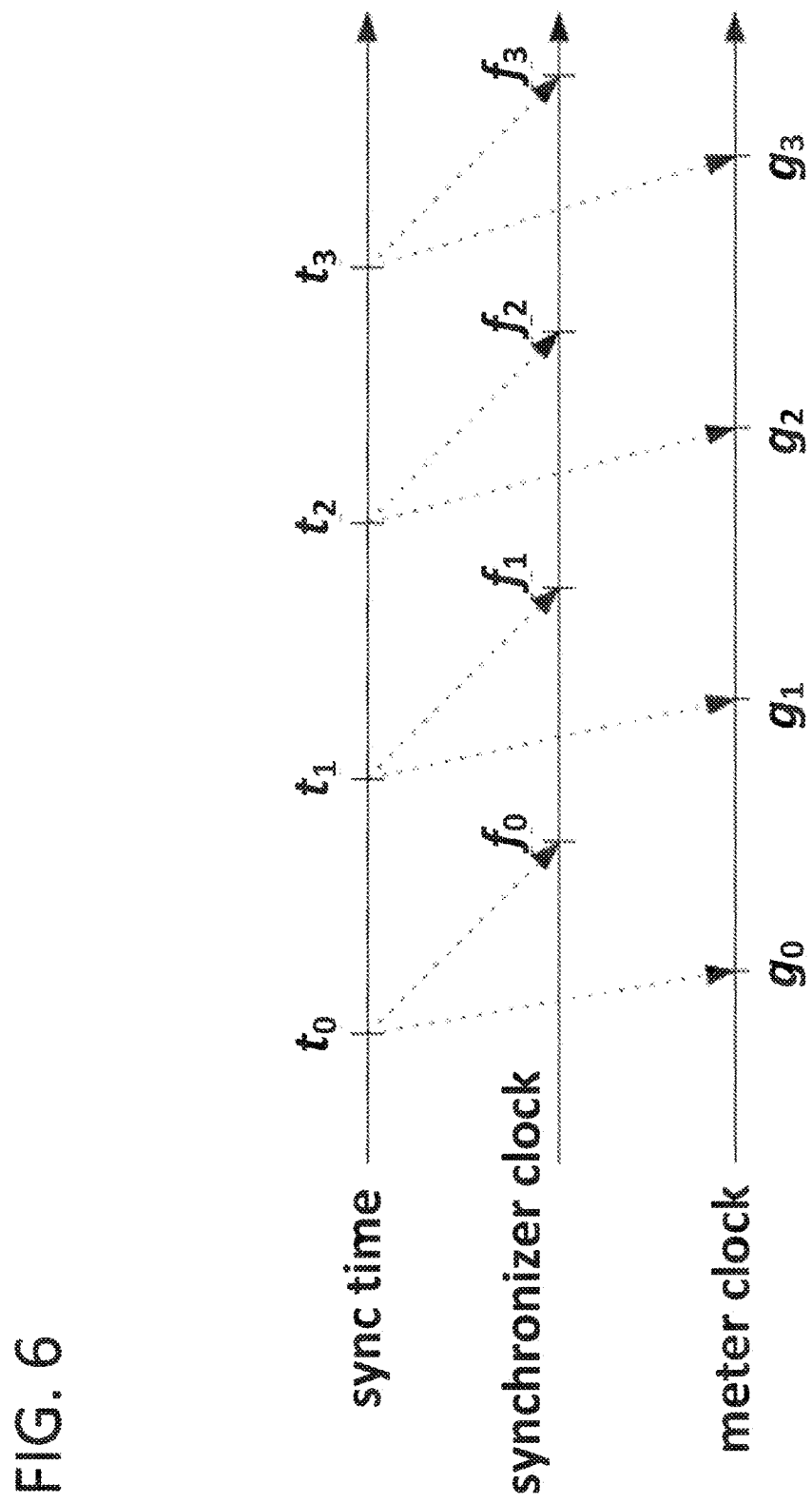
FIG. 6 is a diagram illustrating one embodiment of differences in clock rates between a synchronizer and a meter.

Differences in clock rates on the synchronizer device 108 and on the metering device 106, as well as imperfections in the sync detection time due to signal degradation and noise, create a situation in which simultaneous events are observed at apparently different times. FIG. 6 illustrates an exemplary scenario in which simultaneous events are observed at apparently different times. The detection time error can be particularly troublesome because the phase error is directly proportional to the detection time error at both locations. By observing multiple events with both clocks, the drift of one clock relative to the other may be estimated. Estimating the relative clock drift makes it possible to mitigate the error in the detection time and correct the phase reported at a remote location. For example, the synchronizer device 108 may be considered a remote location relative to the metering device 106 and vice versa.

Consider two unsynchronized clocks that each report the present time as functions f(t) and g(t) of true time t. Given that both functions f and g are one-to-one (e.g., will not report the same time at two different times) and continuous, then there exists a function, h, that maps the time reported by clock g to the time reported by clock f. In other words h(g(t))=f(t). The h function must also be one-to-one and continuous and therefore it can be represented by the expansion $$h(g) = \sum_{k=0}^{\infty} h_k (g-g_0)^k \qquad (9)$$

Supposing that a sequence of N events are observed on both clocks, if the true times of each event are $t_0, t_1, \ldots, t_{N-1}$, then the times recorded for the nth event on each clock are $$f_n = f(t_n) + e_{f,n} \qquad (10)$$

$$g_n = g(t_n) + e_{g,n} \qquad (11)$$

where $e_{f,n}$ and $e_{g,n}$ are measurement errors associated with each clock. For example, the errors may be due to the imperfections in estimating the sync time. Given clock f measurements $f_0, f_1, \ldots, f_{N-1}$ and clock g measurements $g_0, g_1, \ldots, g_{N-1}$ an estimate of $h_0, h_1, \ldots, h_K$ can be estimated by regression in accordance with an aspect of the invention. This gives a method for converting from one clock to the other. The optimal value of K<N will depend on the clocks.

In one form, the ability to convert from one clock to another can be used to correct errors in the relative phase measurement that are due to differences in the time at which the phases were measured because of the error terms $e_{f,n}$ and $e_{g,n}$. The phasors measured at each clock are derived from complex sinusoids operating at different phase angles:

$$v_{beacon} = \exp(j\omega_c f_n + j\phi_n) \qquad (12)$$

$$v_{meter} = \exp(j\omega_c g_n + j\phi_n) \qquad (13)$$

The synchronizer phasor, expressed by Equation (12), is observed at a different time than the meter phasor, expressed by Equation (13), because of the error, $e_{f,n}$. The time of observation of the meter phasor in the synchronizer's clock, $h(g_n)$, is estimated However, we can estimate what time the meter phasor was observed in the synchronizer's clock, $h(g_n)$:

$$v_{beacon} = \exp(j\omega_c h(g_n) + j\phi_n) \qquad (14)$$
$$= \exp(j\omega_c (h(g_n) - f_n) + j\omega_c f_n + j\phi_n)$$
$$= \exp(j\omega_c f_n + j\omega_c (h(g_n) - f_n) + j\phi_n)$$

Equation (14) has the same first term in the kernel as Equation (12), but with a different phase term. This represents a correction in phase due to the difference in sampling times at both locations, given that the sinusoid frequency, $\omega_c$, is known. That phase term is $$\angle(v_{beacon}) = \omega_c(h(g_n) - f_n) + \phi_n \qquad (15)$$

In other words, the measured phase at clock r can be corrected by adding $\omega_c (h(g_n) - f_n)$ to it. It is of interest to note that $h(g_n) - f_n$ is the residual from the regressive fit of $g_n$ to $f_n$.

Figure 7:
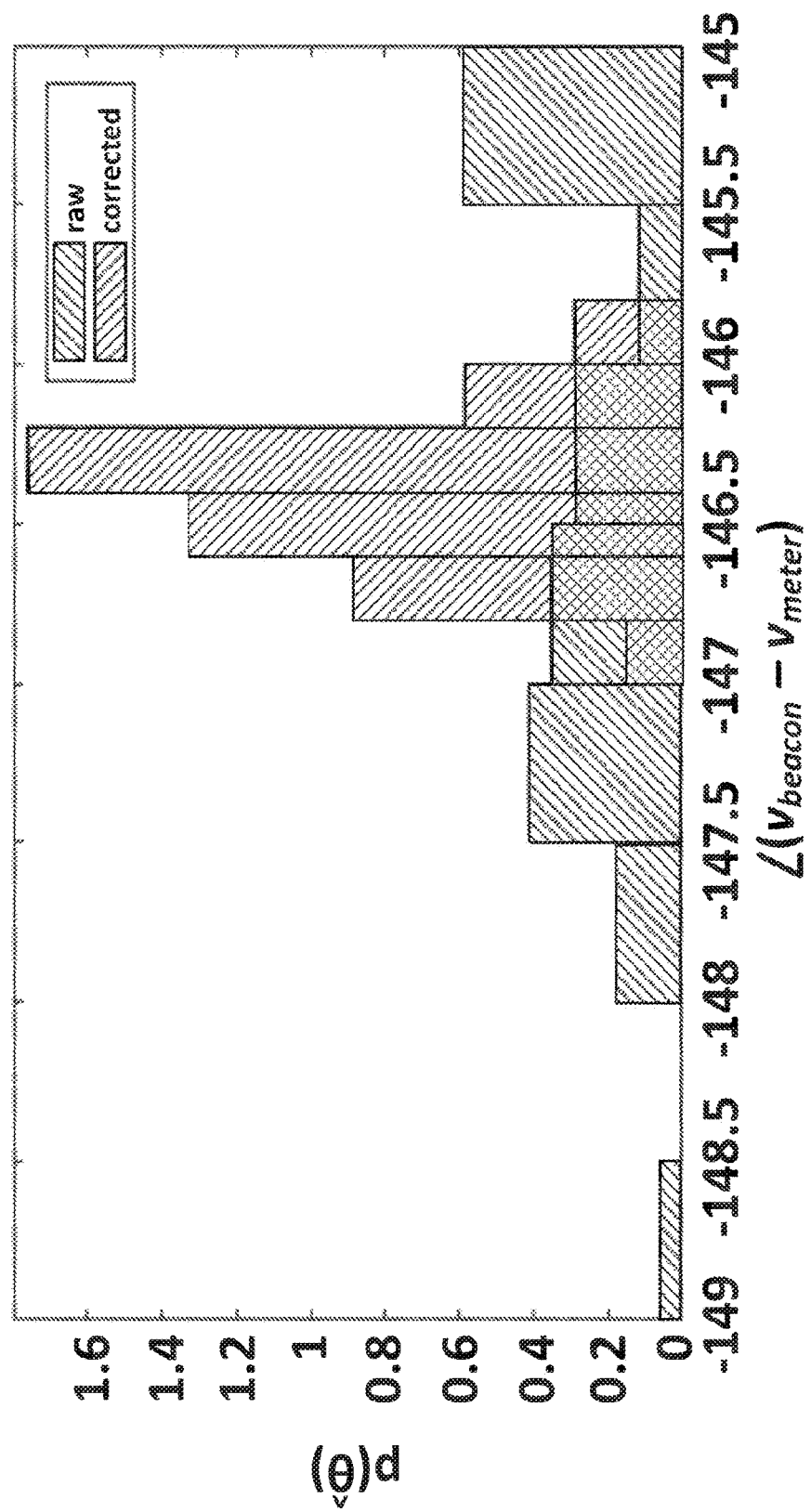
FIG. 7 is a graph illustrating one embodiment of exemplary probability density functions of the phasor measurement system of FIG. 1.

Applying Equation (15) to the data set of FIG. 5 results in the probability density functions illustrated in FIG. 7. The standard deviation of the raw phasors is 0.9961° and the standard deviation of the corrected phasors is 0.2398°. For 60 Hz mains, this corresponds to a time-synchronization standard deviation of 46.1 μs for the raw phasors and 11.1 μs for the corrected phasors. As shown above, the frequency term, $\omega_c$, is the same in both Equations (12) and (13). In one form, this frequency term may be different for both clocks since both clocks progress at a different rate. In another form in which the true sinusoidal frequency is 60 Hz, the clocks f and g do not differ by more than a few parts per million and the difference in frequency is negligible. The synchronization algorithm described herein may also utilize real-time updating of the clock synchronization function, h, such as via a Kalman filter, for example.

In one form, aspects of the invention provide a sine wave phase determination from zero-crossings of its waveform. The phase of a pure sinusoid at any arbitrary reference time $t_{ref}$ can be determined from the position of its zero-crossings relative to that reference time. This property follows from the fact that the phase angle is a linear function of time when frequency is constant $$\phi(t) = \phi(t_{ref}) + 2\pi[(t - t_{ref})/T], \qquad (16)$$

where T, which is the period of the sinusoid, can be determined by measuring the time between any pair of zero-crossings and the number of half-periods that they span.

Once reference time $t_{ref}$ is established, and T is determined, the amount of time between $t_{ref}$ and the next upward (e.g., negative to positive) zero-crossing at $t_{zc+}$ or downward (e.g., positive to negative) zero-crossing at $t_{zc-}$ can be converted into a phase angle. Recognizing that the phase angle of a sine wave is zero, by definition, at an upward zero-crossing $$\phi(t_{zc+}) = 0 = \phi(t_{ref}) + 2\pi[(t_{zc+} + t_{ref})/T] \qquad (17)$$

it follows that $$\phi(t_{ref}) = -2\pi[(t_{zc+} - t_{ref})/T] \qquad (18)$$

Similarly, the phase of a sinusoid is π, by definition, at a downward zero-crossing $$\phi(t_{zc-}) = \pi = \phi(t_{ref}) + 2\pi[(t_{zc-} - t_{ref})/T] \qquad (19)$$

and it follows that $$\phi(t_{ref}) = \pi - 2\pi[(t_{zc-} - t_{ref})/T] \qquad (20)$$

The above technique assumes a pure sinusoid with no DC offset, harmonic content, or noise, which may not hold for powerline waveforms. Powerline waveforms may have significant even-harmonic content that destroys symmetry above and below zero volts or may be corrupted by noise sufficient to create multiple actual zero-crossings in the vicinity of each theoretical zero-crossing. In this case, use of any single measured zero-crossing, upward or downward, as the basis for determination of phase may produce incorrect results because of the noise and distortion in the waveform. The phase expressions in Equations (18) and (20) can be used to exploit multiple measured zero-crossings in a manner that can improve the estimates of both the phase angle at $t_{ref}$ and the sine wave period T, as further described herein.

Figure 8:
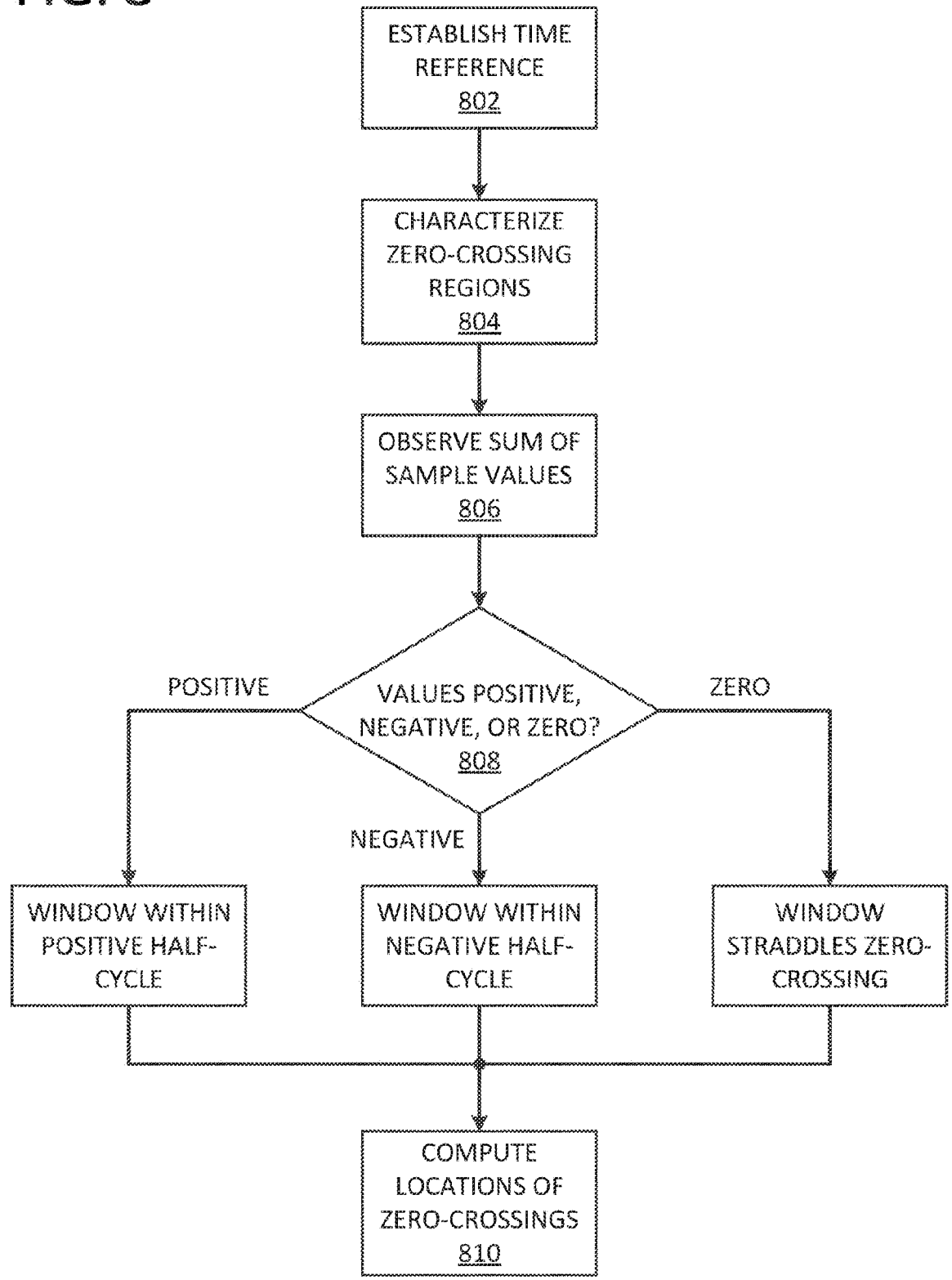
FIG. 8 is a diagram illustrating one embodiment of an exemplary operation of the phasor measurement system of FIG. 1.
Figure 9:
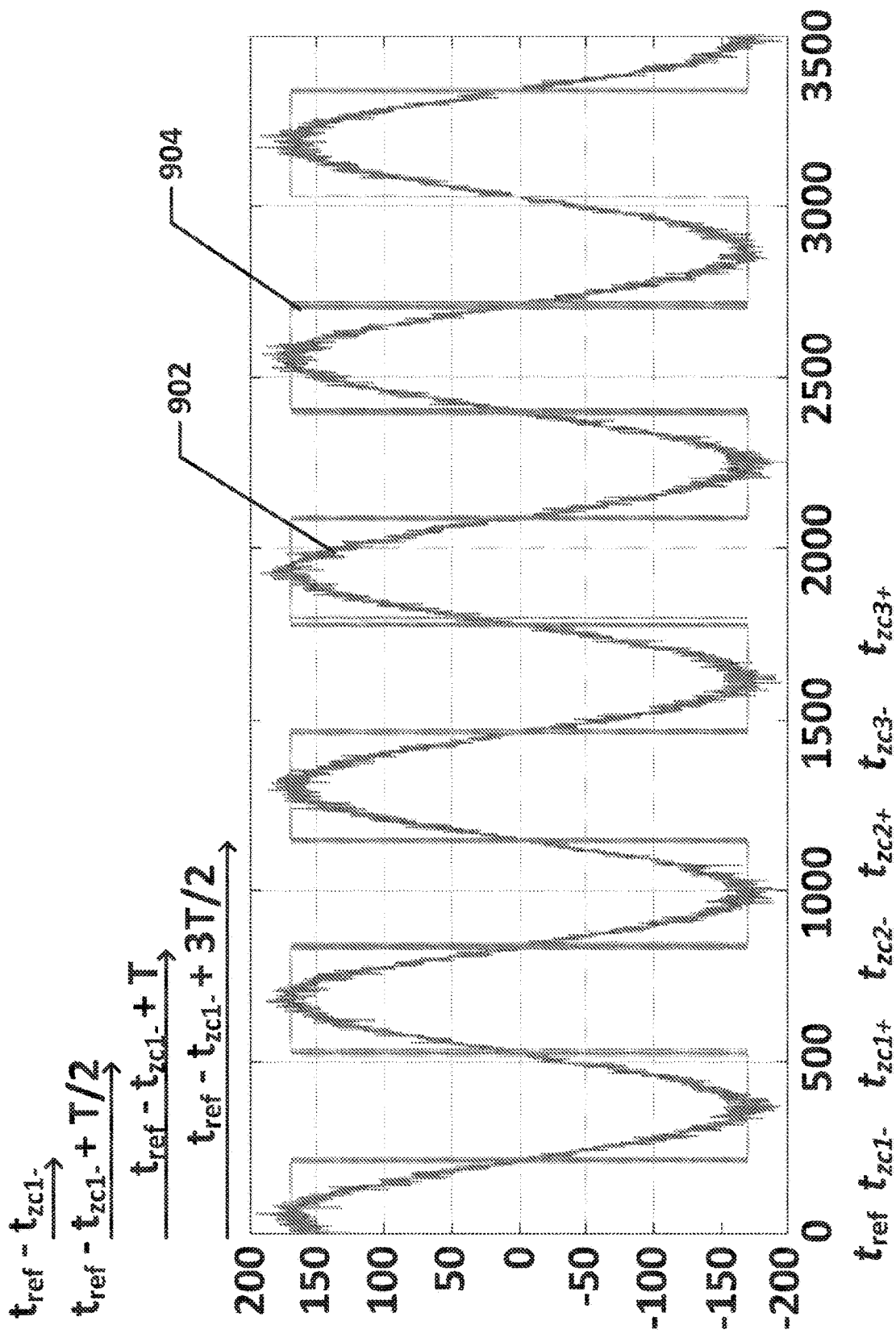
FIG. 9 is a diagram illustrating one embodiment of an exemplary waveform of the phasor measurement system of FIG. 1.

FIG. 8 illustrates an exemplary algorithm stored in a non-transitory, tangible medium such as a memory device and executed by one or more processors for estimating a phase angle at a reference time and a sine wave period. For example the illustrated algorithm may comprise algorithm 220 and/or algorithm 322. FIG. 9 illustrates an exemplary sinusoidal waveform 902 and hard-clipped signal 904 with a reference time and zero-crossing times. PLLs, such as those described herein, are well-suited to extraction of the fundamental component of the power line waveform 902, including tracking the fundamental component through small changes in frequency. The sine wave output of the PLL (e.g., exemplary sinusoidal waveform 902) serves as a representation of the power line fundamental even in low signal-to-noise ratio (SNR) cases. The period and phase of the power line signal sinusoidal waveform 902 can be inferred from measurements of its zero-crossings relative to an arbitrary reference time. Use of multiple zero-crossings improves the estimates of both parameters when the information is utilized in a linear regression. Combination of PLLs with regression of multiple zero-crossings produces certain benefits. For example, the PLL improves the fidelity of the power line waveform and the regression of the zero-crossings of the PLL output waveform improves the fidelity of the estimates of power line period and phase.

With continued reference to FIGS. 8 and 9, the reference time $t_{ref}$ is established at step 802. For phasor measurements, $t_{ref}$ corresponds to the location of the received synchronization pulse, in one form. The actual positions of any zero-crossing regions of the sinusoidal waveform 902 are characterized, at step 804, over a span of one or more half periods. The number of zero-crossing regions to be characterized is arbitrary and need not be consecutive. The algorithm slides a window across the hard-clipped signal 904 and observes the sum of the hard-clipped sample values within that window at step 806. In one form, the hard-clipped signal 904 is a "hard clipped" version of the sinusoidal waveform 902 (e.g., the hard-clipped signal 904 value is +X when the input signal is positive and is -X when the input signal is negative, where X is an arbitrary positive value) that facilitates identification of the zero-crossings. At step 808, it is determined whether the values within the sliding window are positive, negative, or zero. If all or nearly all of the values within the sliding window are positive, then the window is known to be within the positive half-cycle of the sinusoidal waveform 902. If all or nearly all of the values within the sliding window are negative, then the window is known to be within the negative half-cycle of the sinusoidal waveform 902. If the sum or average of the values in the sliding window is approximately zero, then the window straddles a zero-crossing of the sinusoidal waveform 902. The direction of the zero-crossing can be inferred from context. At step 810, the positions of any or all measured zero-crossings within the window are entered into matrix equations and the estimated locations of the actual sinusoidal waveform 902 zero-crossings are computed by linear regression using matrix inversion. For phasor measurements, the algorithm may be applied to the sine wave output of a PLL (e.g., PLLs 216, 308, and/or 316 described herein) where the signal fidelity improvements made by the PLL are augmented by the zero-crossing regression. In another form, such as those situations having a high signal-to-noise ratio, the PLL can be omitted and the zero-crossing regression may be applied directly to the power line waveform.

The matrix equations resulting from the exemplary embodiments illustrated in FIG. 9 are of the form in Equation 21:

$$\begin{bmatrix} t_{zc1-} \\ t_{zc1+} \\ t_{zc2-} \\ t_{zc2+} \\ t_{zc3-} \\ t_{zc3+} \\ \vdots \end{bmatrix} = \begin{bmatrix} 1 & 0 \\ 1 & 1/2 \\ 1 & 1 \\ 1 & 11/2 \\ 1 & 2 \\ 1 & 21/2 \\ \vdots & \vdots \end{bmatrix} \begin{bmatrix} t_{init} \\ T \end{bmatrix} \quad (21)$$

For the exemplary embodiment of FIG. 9, where there are multiple zero-crossings in each zero-crossing region, the matrix equations are of the form in Equation 22:

$$\begin{bmatrix} 270.5 \\ 290.5 \\ 292.5 \\ \vdots \\ 589.5 \\ 599.5 \\ 606.5 \\ 620.5 \\ \vdots \\ 901.5 \\ \vdots \end{bmatrix} = \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix} \begin{bmatrix} t_{init} \\ T \end{bmatrix} \quad (22)$$

Values for $t_{init}$ and T may be estimated from zero-crossings in one or more zero-crossing regions of the input sinusoid by means of a Moore-Penrose pseudoinverse as in Equation 23:

$$\left[ \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix}^T \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix} \right]^{-1} \begin{bmatrix} 1 & 0 \\ 1 & 0 \\ 1 & 0 \\ \vdots & \vdots \\ 1 & 1/2 \\ 1 & 1/2 \\ 1 & 1/2 \\ 1 & 1/2 \\ \vdots & \vdots \\ 1 & 1 \\ \vdots & \vdots \end{bmatrix}^T \begin{bmatrix} 270.5 \\ 290.5 \\ 292.5 \\ \vdots \\ 589.5 \\ 599.5 \\ 606.5 \\ 620.5 \\ \vdots \\ 901.5 \\ \vdots \end{bmatrix} \approx \begin{bmatrix} t_{init} \\ T \end{bmatrix} \quad (23)$$

Referring further to FIG. 9, the times $t_{zc1-}$ through $t_{zc3+}$ denote an exemplary span of half-periods over which the zero-crossing regions of the waveform are characterized. The algorithm illustrated in FIG. 8 exploits the fact that the time associated with every zero-crossing that occurs after $t_{ref}$ can be expressed as the sum of the time to the initial zero crossing, $t_{init} = t_{zc+} - t_{ref}$ or $t_{init} = t_{zc-} - t_{ref}$ plus an integer multiple of T/2, as illustrated by FIG. 9.

In an embodiment, synchronized phasor measurement system 100 includes an electric distribution network (e.g., power distribution network 104), at least one metering device 106 connected to the electric distribution network, and synchronizer device 108. The synchronizer device 108 is connected to the electric distribution network at a three-phase point of the network (e.g., coupler 210). The synchronizer device 108 is adapted to generate a beacon transmitting to the at least one metering device 106 via the electric distribution network. The beacon comprises a synchronization pulse adapted to establish a common time reference between the synchronizer device 108 and the at least one metering device 106. The beacon comprises reference phasor data adapted to establish phase references relative to the synchronizer device 108 at the at least one metering device 106.

In another embodiment, synchronizer device 108 includes synchronization pulse generator 202, coupler 210, A/D converter 212, detector 218, PLL 216, and modulator 204. The synchronization pulse generator 202 is adapted to generate the synchronization pulse of the beacon. The coupler 210 is adapted to couple the synchronizer device 108 to an electric distribution network (e.g., power distribution network 104) and adapted to transmit the beacon on the electric distribution network. The A/D converter 212 is adapted to sample a voltage on the electric distribution network at coupler 210. The detector 218 is adapted to detect the transmitted beacon in the sampled voltage. The PLL 216 is adapted to track a phase of the sampled voltage. The modulator 204 is adapted to modulate a time of detection of the beacon, the phase of the sampled voltage at the time of detection, and the amplitude of the sampled voltage with a second synchronization pulse generated by the synchronization pulse generator 202 to generate a second beacon. The second beacon enables a phase A metering device (e.g., metering device 106-A), a phase B metering device (e.g., metering device 106-B), and a phase C metering device (e.g., metering device 106-C) to each determine a voltage phasor relative to the phase of the voltage at the synchronizer device 108 and each determine a current phasor relative to the phase of the voltage at the synchronizer device 108.

In yet another embodiment, a method in accordance with an embodiment of the invention includes generating (402), by synchronizer device 108, a first beacon comprising a first synchronization pulse and a first communications package. The synchronizer device 108 transmits (404) the first beacon to one or more electric meters 106 connected to the synchronizer device via an electric distribution network (e.g., power distribution network 104). The synchronizer device 108 is coupled to the electric distribution network at a three-phase connection point (e.g., coupler 210). The synchronizer device 108 measures (406-414) a phase and an amplitude of a voltage on the electric distribution network at the three-phase connection point during the transmitting of the first beacon. The measured voltage phase and the measured voltage amplitude comprise a reference voltage phasor corresponding to the first synchronization pulse. The method also includes generating (402), by the synchronizer device 108, a second beacon comprising a second synchronization pulse and a second communications package. The second communications package comprises the reference voltage phasor corresponding to the first synchronization pulse. The synchronizer device 108 transmits (404) the second beacon to the electric meters 106 to determine a voltage phasor measured at the meters relative to the reference voltage phasor at a time of receiving the first beacon.

In one form, the second communications package further comprises the reference voltage phasor, a time stamp, and an index corresponding to the first synchronization pulse. In this form, the second beacon enables the electric meters 106 to determine a voltage phasor measured at the meters relative to the reference voltage phasor at the time of receiving the first beacon.

In another form, the method further includes measuring, by synchronizer device 108, a phase and an amplitude of a current on the electric distribution network at the three-phase connection point during transmitting of the first beacon. The measured current phase and the measured current amplitude comprise a reference current phasor corresponding to the first synchronization pulse.

In yet another form, the second communications package further comprises the reference current phasor, a time stamp, and an index corresponding to the first synchronization pulse. The second beacon enables the electric meters 106 to determine a current phasor measured at the meters relative to the reference current phasor at the time of receiving the first beacon.

In another form, the electric distribution network comprises an alternating current, three-phase electric distribution network. Transmitting the first beacon comprises the synchronizer device 108 transmitting the first beacon on at least one of the three phases, and transmitting the second beacon comprises the synchronizer device 108 transmitting the second beacon on at least one of the three phases.

In yet another form, transmitting the first beacon and the second beacon comprises the synchronizer device 108 transmitting the first beacon and the second beacon, respectively, via the electric distribution network at a frequency of at least about 1 kHz.

In another form, the method further includes receiving, by the electric meter 106, the second beacon. The electric meter 106 detects the second synchronization signal comprising the second beacon. The electric meter 106 stores on a storage device of the meter a voltage phasor and a current phasor of electric power on the electric distribution network at a time of the detecting. The electric meter 106 decodes the second communications package of the second beacon. The electric meter 106 determines a phase difference between the stored voltage phasor and the reference voltage phasor, and a phase difference between the stored current phasor and the reference current phasor.

In yet another form, the method includes PLL 216 of the synchronizer device 108 tracking a phase of the AC power on the electric distribution network at the connection point of the synchronizer device 108. The method also includes PLL 316 of the electric meter 106 tracking a phase of the AC power on the electric distribution network at the meter.

In another form, the first synchronization signal of the first beacon provides at least one of a temporal reference for sampling the first beacon by the electric meter 106 and a signal for the first communications package. The second synchronization signal of the second beacon provides at least one of a temporal reference for sampling the second beacon by the electric meter 106 and a signal for the second communications package.

In yet another form, the method further includes the electric meter 106 extracting a magnitude and a phase of a voltage phasor and a current phasor at arbitrary times.

In another form, the method further includes the electric meter 106 establishing a time reference corresponding to a temporal location of the first synchronization pulse. The electric meter 106 characterizes positions of zero-crossing regions of a waveform indicative of electric voltage on the electric distribution network over a span of one or more half-periods of the waveform. The electric meter 106 estimates a period and a phase of the voltage waveform by linear regression of the positions of one or more zero-crossings within the zero-crossing regions. The electric meter 106 characterizes positions of zero-crossing regions of a waveform indicative of electric current on the electric distribution network over a span of one or more half-periods of the waveform. The method also includes estimating, by the electric meter 106, a period and phase of the current waveform by linear regression of the positions of one or more zero-crossings in the zero-crossing regions.

In yet another form, the second communications package comprises synchronous phasor measurements indicative of at least one of a voltage and a current on the electric distribution network at the connection point of the synchronizer device.

In one form, aspects of the invention provide feasible, low-cost systems and methods for synchrophasor measurement in distribution networks, such as those that include smart infrastructure products and services. The ability to measure voltage and current phasors relative to the substation will facilitate solutions to outstanding smart grid problems, as described herein. In accordance with an aspect of the invention, outbound TWACS may be used to generate beacons.

In another form, aspects of the invention provide systems and methods capable of wiring phase detection, floating neutral detection, identification of undesirable wiring scenarios, load imbalances, and excessive neutral current. The systems and methods provide real-time monitoring and management of phasor data, retrieve phasors across a network, even if bandwidth-limited, estimate phasors at nodes not containing sensors by combining probabilistic inference with knowledge of the electrical parameters of the network, and identify faulty equipment from phasor data.

In yet another form, aspects of the invention provide at least some degree of autonomous control over system 100 by including capacitor banks, voltage regulators, and feeder switching controls in an advanced metering infrastructure (AMI) network. For example, these control devices can be implemented with a positive feedback loop to automatically maintain high power factor and voltage balance by real-time analysis of synchronized phasor data as described herein. The systems and methods described herein are also capable of utilizing more than just sparsely sampled phasors from the network. For example, time-synchronous signal monitoring may be provided by every metering device on a network. In accordance with such systems and methods, full time-domain sampled signals are retrieved from every endpoint (e.g., metering device 106). Such a technique may be utilized to locate faults before and after critical system events, control distributed generation sources, and like system monitoring functions.

As will be understood by one having ordinary skill in the art, aspects of the invention described herein cannot be attained by putting a GPS device on each meter and using the common time base it provides because the reference phase information required for the computation of phasor angles is not available to remote devices. For example, a GPS-based implementation requires the raw, unreferenced phasors to be uploaded to a central processing station, which burdens the AMI system, requires time for communications transmission, and may be limited to transmission networks.

Although certain exemplary aspects of the invention are described herein with reference to electric distribution networks having a line frequency of 60 Hz, one having ordinary skill in the art will understand that other frequencies (e.g., 50 Hz) are within the scope of the invention.

Figure 10:
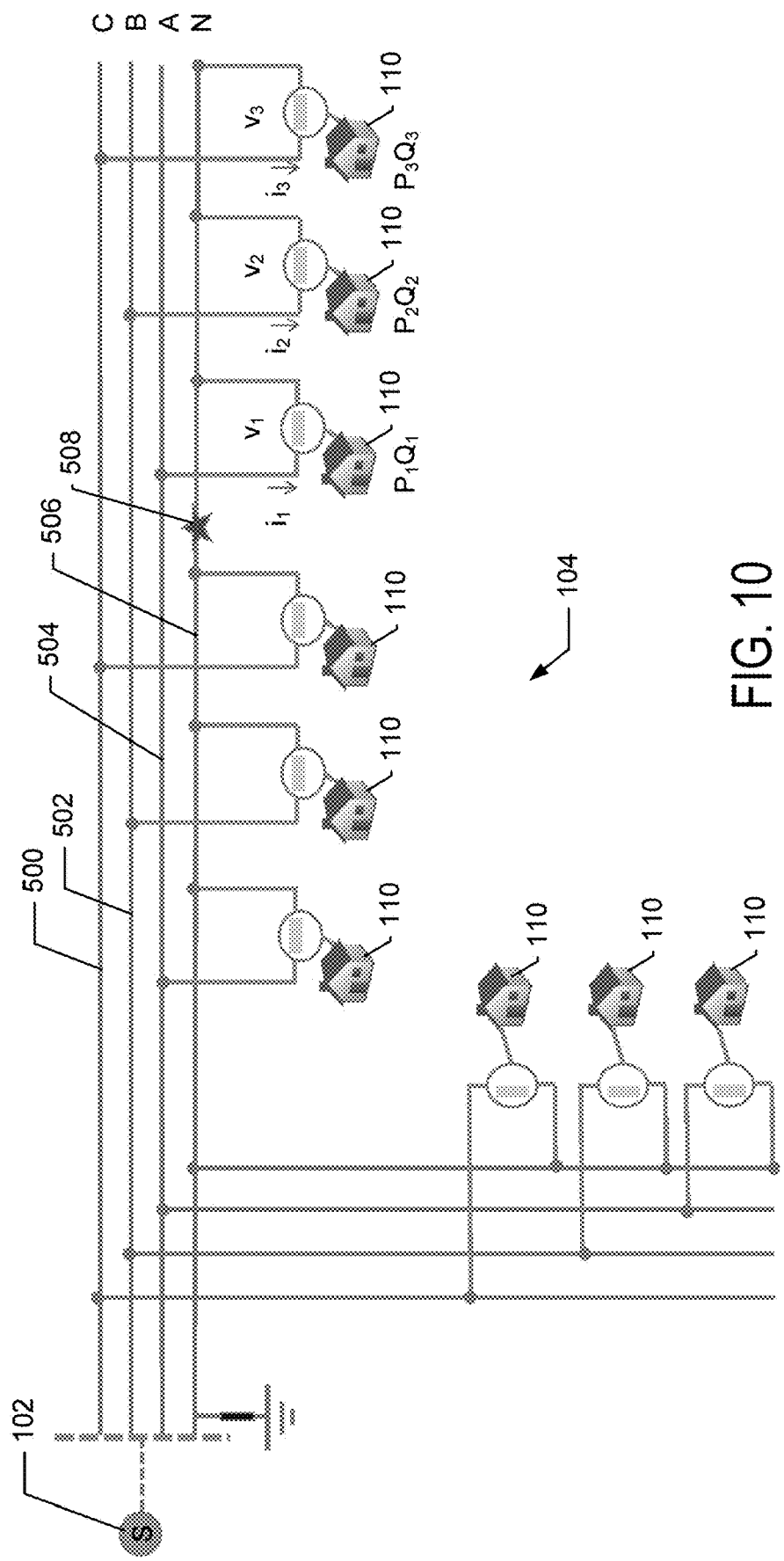
FIG. 10 is a schematic diagram of an example distributed power network.
Figure 11:
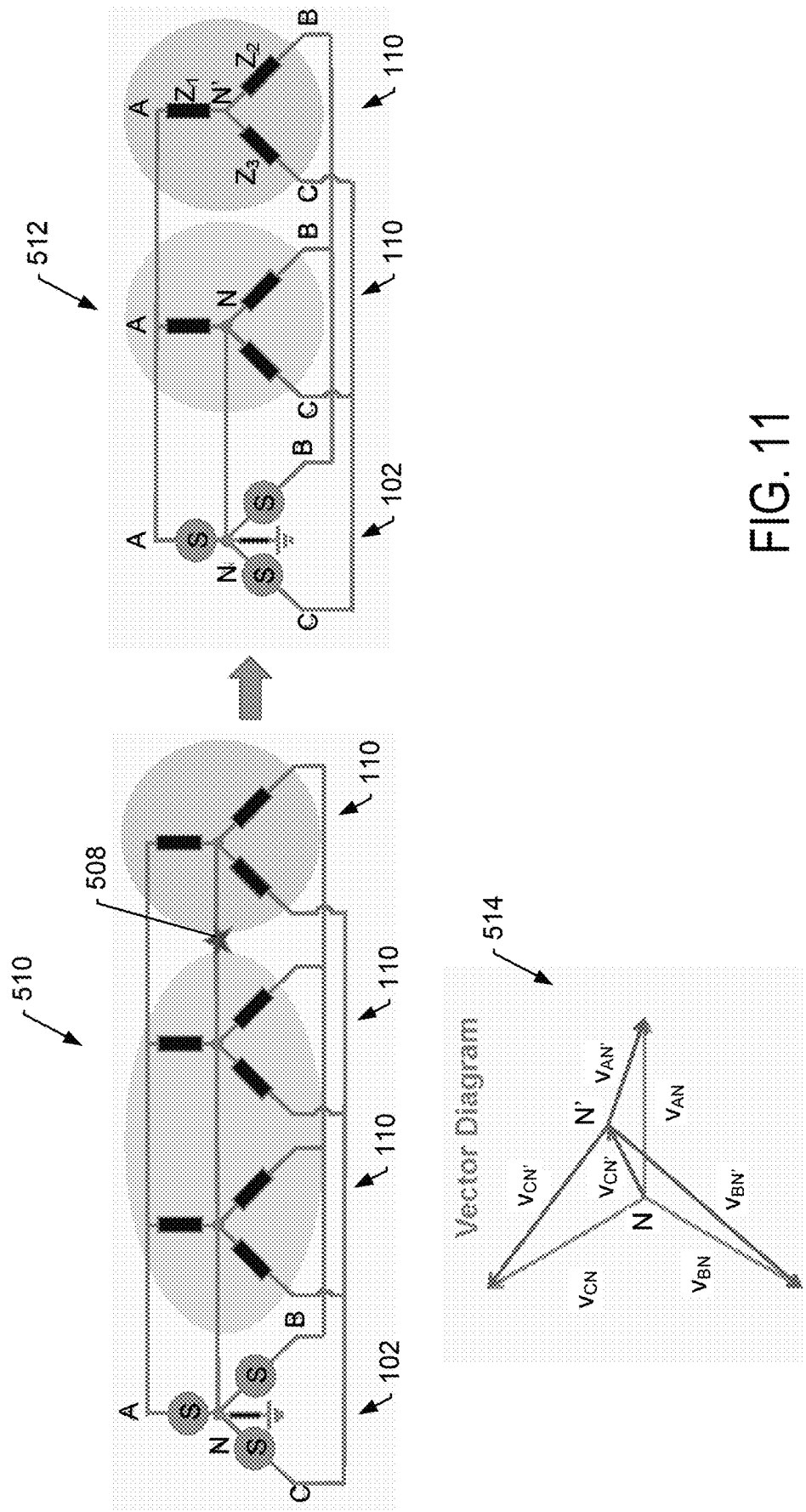
FIG. 11 includes circuit node diagrams and a vector diagram of the example distributed power network of FIG. 10.

FIG. 10 illustrates an example power distribution network 104 that includes a power substation 102 in communication with a transmission line "A" 500, transmission line "B" 502, transmission line "C" 504, along with a common neutral line "N" 506. As show, a number of end consumers 110, which may be industrial users, commercial users, or residential users, are in communication with one of the transmission lines 500-504 and the neutral line 506 to receive electrical power. An example floating neutral fault condition 508 is also shown. FIG. 11 includes node diagrams 510-512 and a vector diagram 514 that provides a simplified view of the power distribution network 104 shown in FIG. 10.

Figure 12:
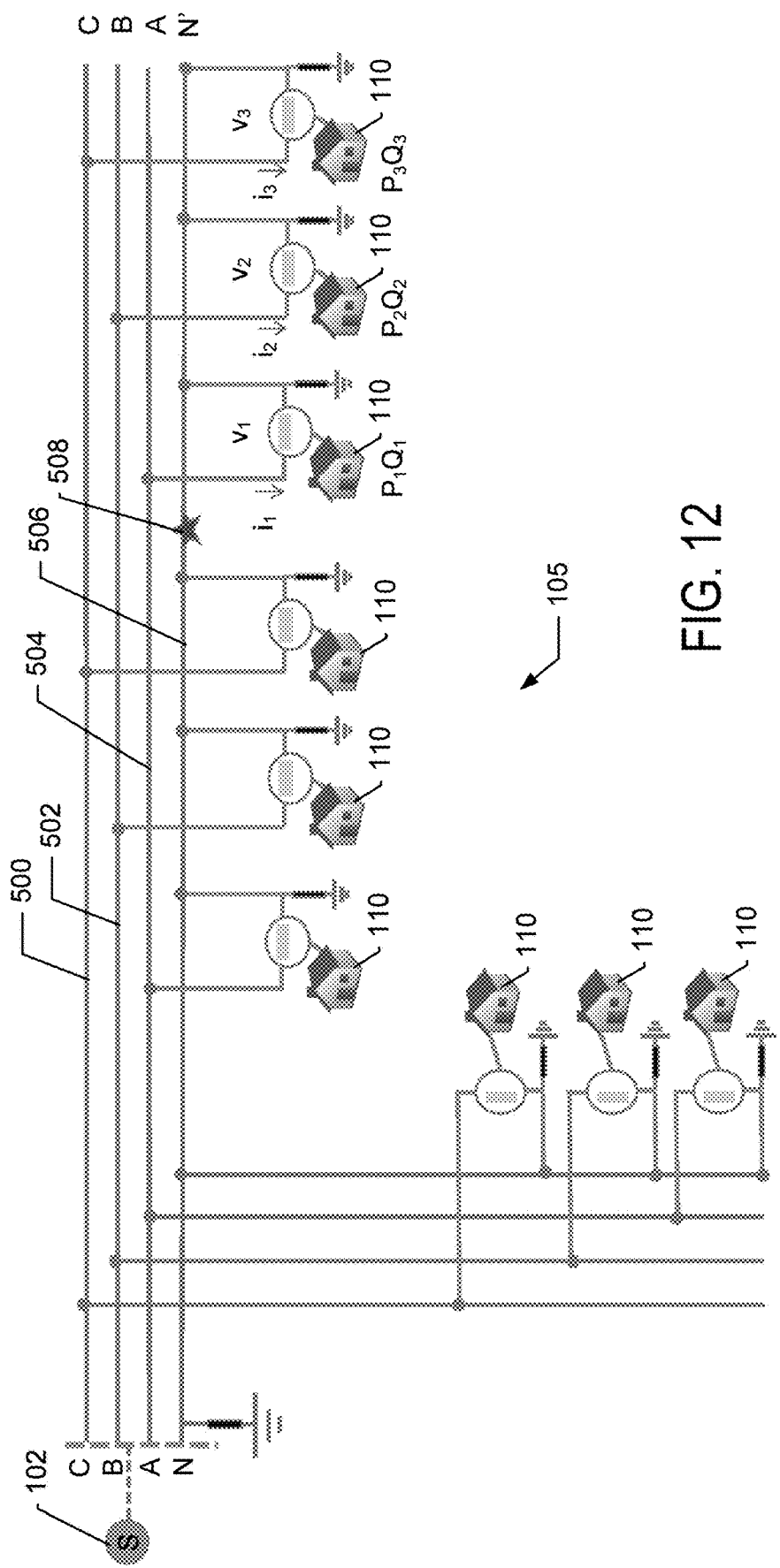
FIG. 12 is a schematic diagram of an example multi-grounded distributed power network.
Figure 13:
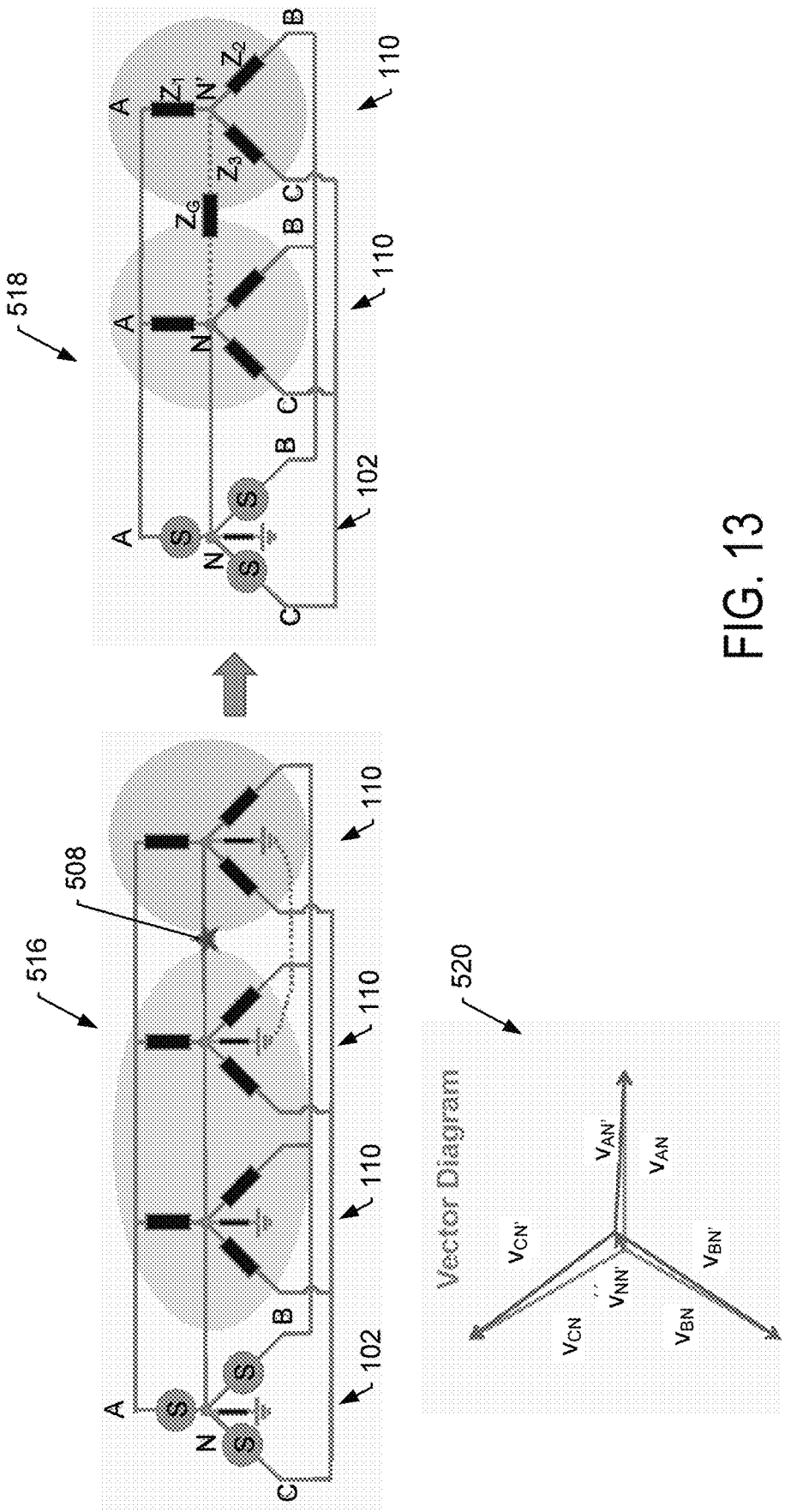
FIG. 13 includes circuit node diagrams and a vector diagram of the example multi-grounded distributed power network of FIG. 12.
Figure 14:
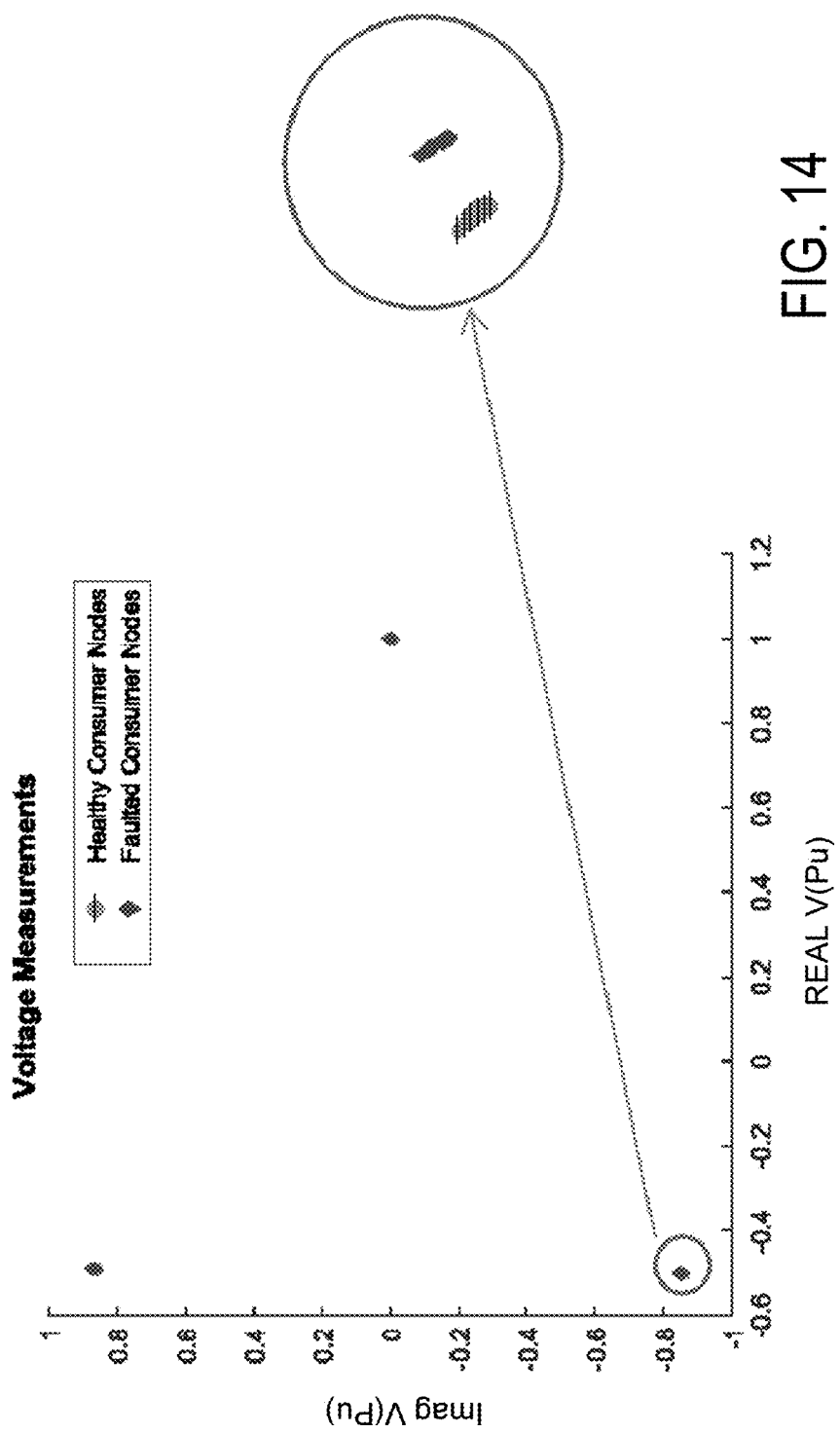
FIG. 14 is a graph plotting simulated real voltages per unit measurements against the phase-shift complex ("imag") voltage per unit for the multi-grounded distributed power network of FIG. 12.

FIG. 12 is an embodiment of another power distribution network 105 that is similar to the distribution network shown in FIG. 10; however, this embodiment of the network 105 shows a multi-grounded network wherein each end consumer 110 is independently grounded. FIG. 13 includes node diagrams 516-518 and a vector diagram 520 that provides a simplified view of the power distribution network 105 shown in FIG. 12. FIG. 14 includes a graph comparing real voltages per unit against the "phase-shift" complex ("imag") voltage for the multi grounded network 105. As shown during a fault condition, the per unit voltage of the real voltage data is greater than that of healthy the phase-shift complex.

Figure 15:
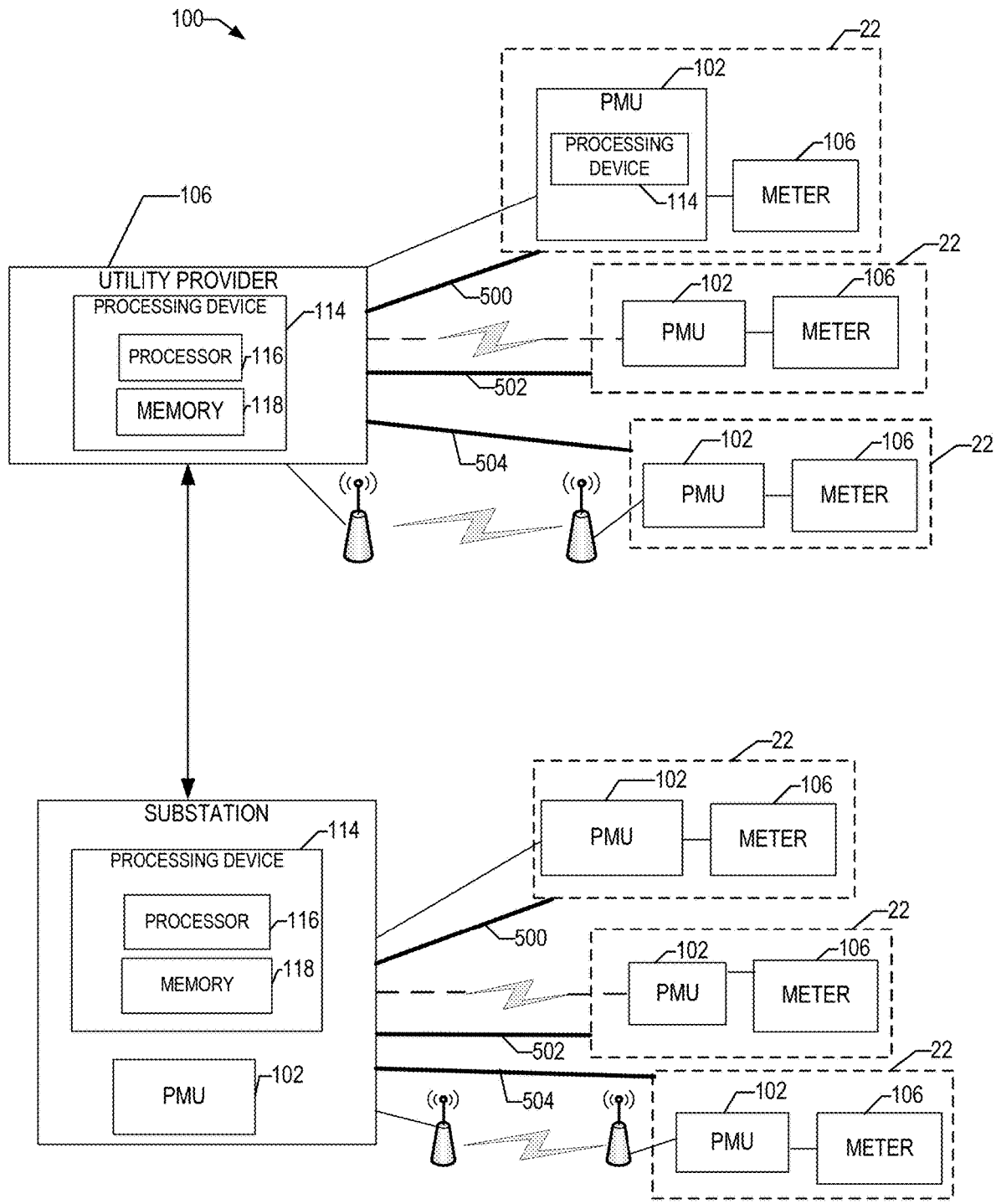
FIG. 15 is diagram of a floating neutral detection and localization system, according to one embodiment.

One embodiment of the floating neutral detection and localization system 1100 is shown in FIG. 15, and includes one or more synchronizers 108 incorporated into or otherwise in communication with a utility meter 106 that is placed at an end consumer's 110 location. In other embodiments, a synchronizer 108 may also be used at one or more substations 102. The synchronizer's 108 are in wired communication, wireless communication, or a combination of both wired and wireless communication with a utility provider facility 112. The utility provider facility 112 or the synchronizer 108 includes one or more processing devices 114 further having a processor 116 to execute transitory and non-transitory instructions or code and memory 118 to store the instructions or code. The processing device 114 is also configured to store and/or receive other data, including but not limited to data related to the power distribution network 104,105. The processing device 114 also includes other components (not shown) commonly found on computing devices for communication, data input, data output, and display purposes.

The floating neutral detection and localization system 1100 may operate by examining the current measurements made by one or more synchronizer 108 to detect a potentially outage causing floating neutral 508. The system 1100 may also detect floating neutrals that cause a decrease in efficiency in the distribution network.

A floating neutral condition can cause voltages to float to a maximum of its Phase voltage relative to ground, thus creating an unbalanced load condition. Such a change in voltage may also flow through one or more affected portions of a power distribution system until a protective device within the distribution network interrupt the circuit. The typical time for this to occur is from 2 to 6 cycles of the 60 Hz waveform propagated through the power distribution system (approximately 0.03-0.1 seconds). This causes a loss in the load imposed on the system from what it was prior to occurrence of the fault. The impact will vary from circuit to circuit, location on a given circuit, and with time of day. The various embodiments of the floating neutral detection and localization system disclosed herein may alert a user to the need for a circuit interruption. Alternatively, the system may automatically trigger a protective device to interrupt the circuit.

Several factors may be considered in providing algorithms used for floating neutral detection. One factor is a nearly constant change in voltage on a feeder as the result of an almost constant change in the load on a monitored circuit imposed by the utility's customers using that circuit. In this regard, small changes appear as low-intensity random events that vary widely over short periods of time.

In some embodiments, to achieve signal classification, the algorithm may employ a technique for extracting relevant features and then used for floating neutral detection and classification. For each suspected floating neutral event, a predetermined number of samples are analyzed.

Referring now to FIG. 17, the node diagram and vector diagram for the multi-grounded distribution network 105 are reproduced along with circuit analysis formulas to determine the voltage vectors for the node 120 that is affected by the floating neutral fault 508. Similarly, the power flow formulas and equations shown in FIG. 18 may further be used to determine the voltages across all nodes of the networks 104 and 105. In one having ordinary skill may easily understand the single phase power equations of Equation 24 and Equation 25:

$$P_k = \Sigma_{i=1}^{N} V_k V_i [G_{ki} \cos \theta_{ki} + B_{ki} \sin \theta_{ki}] \quad (24);$$

and, $$Q_k = \Sigma_{i=1}^{N} V_k V_i [G_{ki} \sin \theta_{ki} - B_{ki} \cos \theta_{ki}] \quad (25);$$

where k=1,N; N=the number of nodes; and $\theta_{ki} = \theta_k - \theta_i$.

Figure 19A:
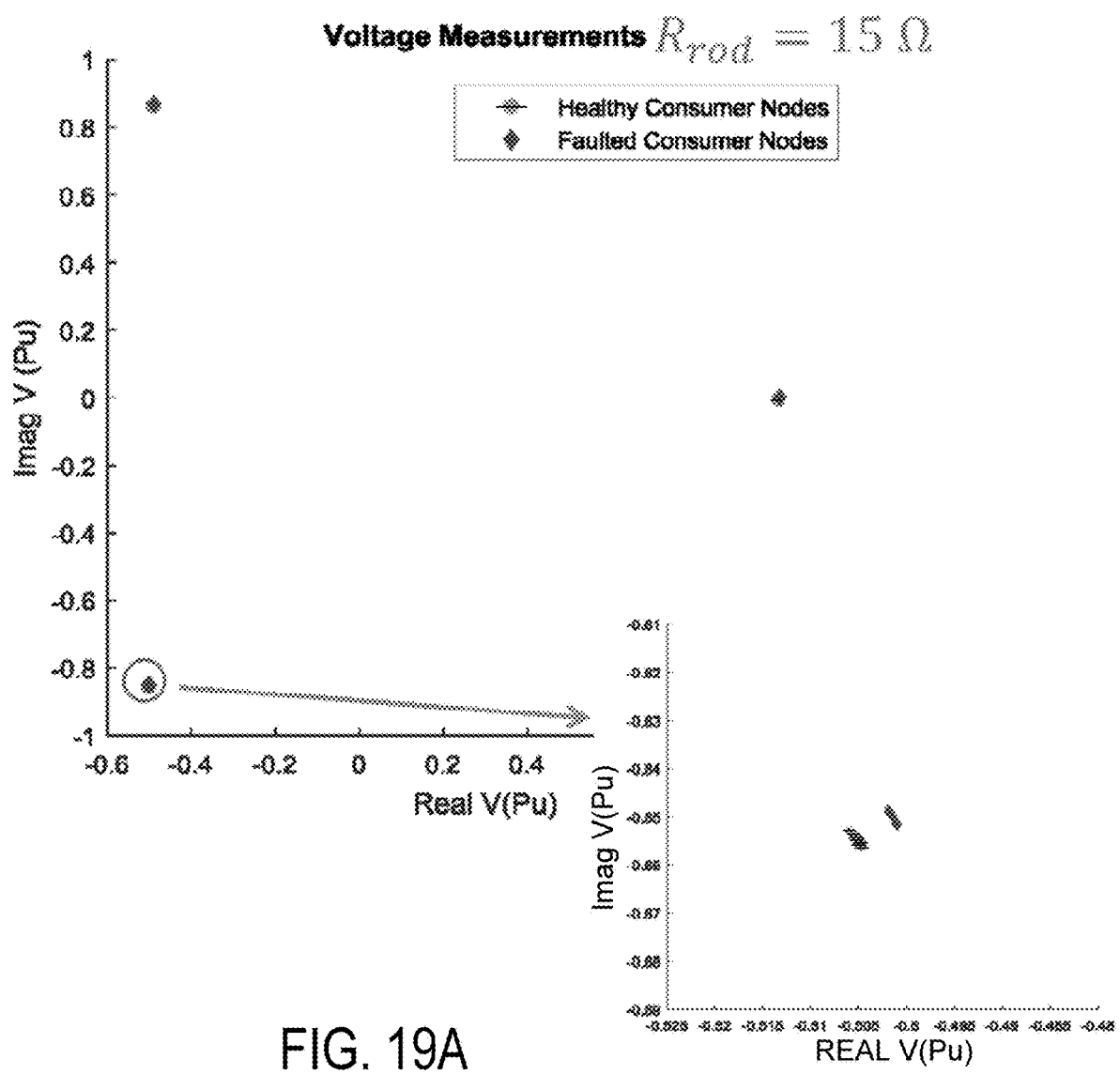
FIGS. 19A and 19B are graphs plotting simulated real voltages per unit measurements against the phase-shift complex ("imag") voltage per unit for ground bars of various resistances in one embodiment of the multi-grounded distributed power network of FIG. 12.
Figure 19B:
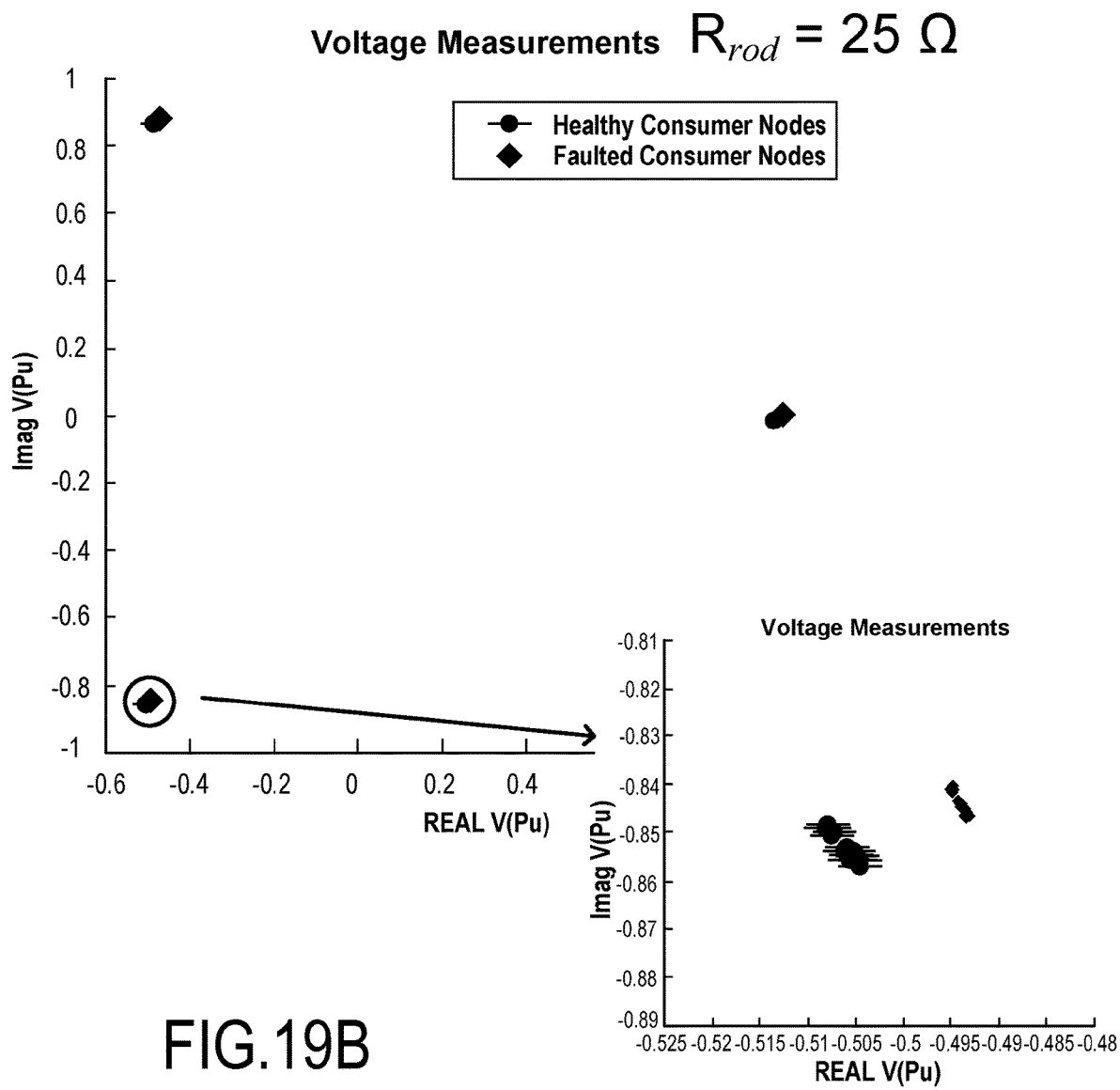

The floating neutral detection and localization system 1100 is well-suited to address and handle the typical difficulties in estimating ground impedance values such as those found in the multi-grounded network 105. It is usually difficult to estimate ground impedance as the current flows uncontrolled through the earth. By way of example and not limitation, some of the variables found in the multi-grounded network 105 that make estimating the ground impedance difficult include the earth impedance. Earth impedance dependents on frequency and soil resistivity, which further depends on soil type, moisture levels, and temperature, among others. Another variable is the ground rod resistance which typically lies in a range between 5 ohms and 25 ohms. Ground rod resistance if further dependent on the physical properties of the ground rod and soil resistivity. FIGS. 19A-19B display simulated neutral fault results for a multi-grounded system based upon varying resistivity of the grounding rods. As shown the voltage values for nodes experiencing faulty neutral conditions are close to those in healthy states making it difficult to identify and locate such floating neutral faults using other systems and methods.

To overcome the difficulties of detecting floating neutral faults in power distribution networks and to help locate such faults, various embodiments of the floating neutral detection and localization system 1100 execute various algorithms and data analysis protocols using various types of data collected from varied sources. In one aspect, the floating neutral detection and localization system 1100 uses voltage phasor and current phasor data collected from synchronizers 108 at one or more end consumer 110 location. The system 1100 also uses network topology data to identify and locate floating neutral faults. The system 1100 may operate in real-time or near-real. Alternatively, the system 1100 need not be real-time and may operate at any time when sufficient data has been collected. In this aspect, multiple measurements from each end consumer meter and synchronizer may be used.

Figure 16:
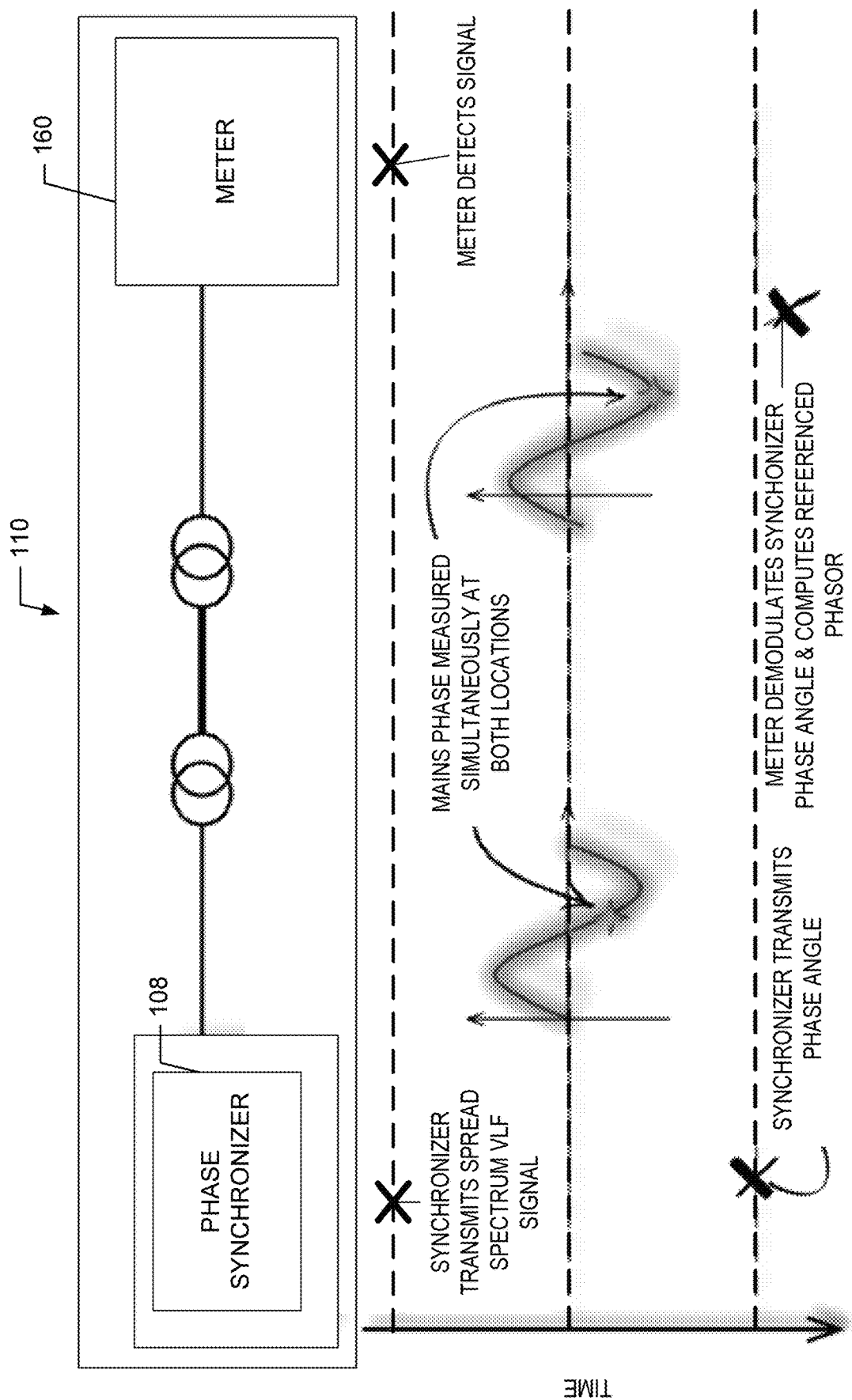
FIG. 16 illustrates the synchronized functions of a phase synchronizer of the floating neutral detection and localization system and a utility meter, according to one embodiment.

FIG. 16 depicts one embodiment of a synchronizer 108 in communication with the utility meter 106 at an end consumer location 110. The synchronizer 108 further includes a phase synchronizer 108. The phase synchronizer 108 measures voltage and current phasors and is synched with a common time source for synchronizing data across the power distribution network 104 and 105. The synchronizer 108 generates and transmits synchrophasor measurements to the utility facility 112 for further analysis. As shown, the synchronizer 108 works in conjunction with the meter 106. In particular, the synchronizer 108 transmits the spread spectrum VLF signal while the meter 106 detects the signal. Later, the Mains phase is measured simultaneously at both the synchronizer 108 and the meter 106. The synchronizer transmits the phase angle while the meter demodulates the synchronizer phase angle data and determines the referenced phasor.

Figure 20:
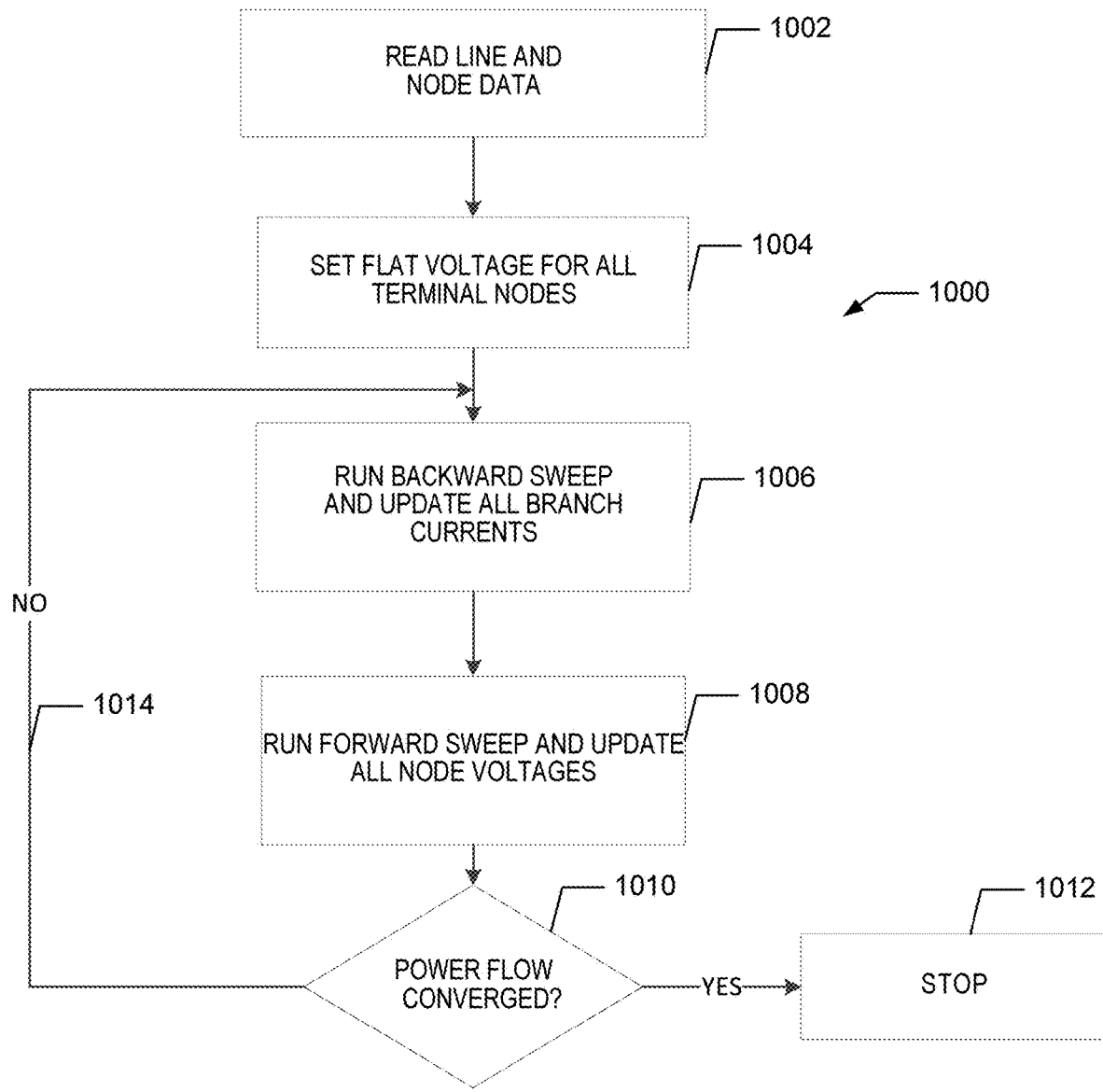
FIG. 20 is a flowchart illustrating one exemplary embodiment of forward and backward sweeping power flow simulation tool used to test various embodiments of the floating neutral detection and localization system.
Figure 23:
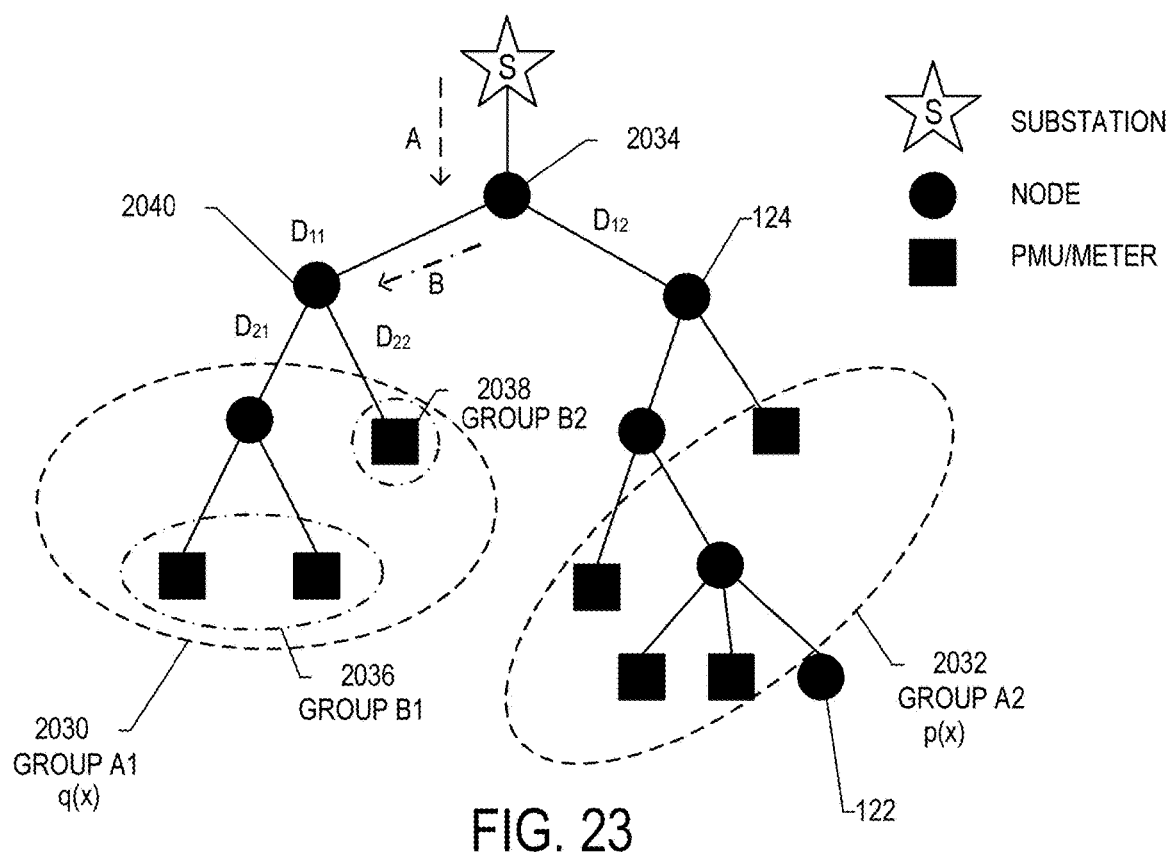
FIGS. 23-24 are node grouping diagrams to illustrate various groupings nodes of a distributed power network according to the statistical classification method of FIG. 22.
Figure 24:
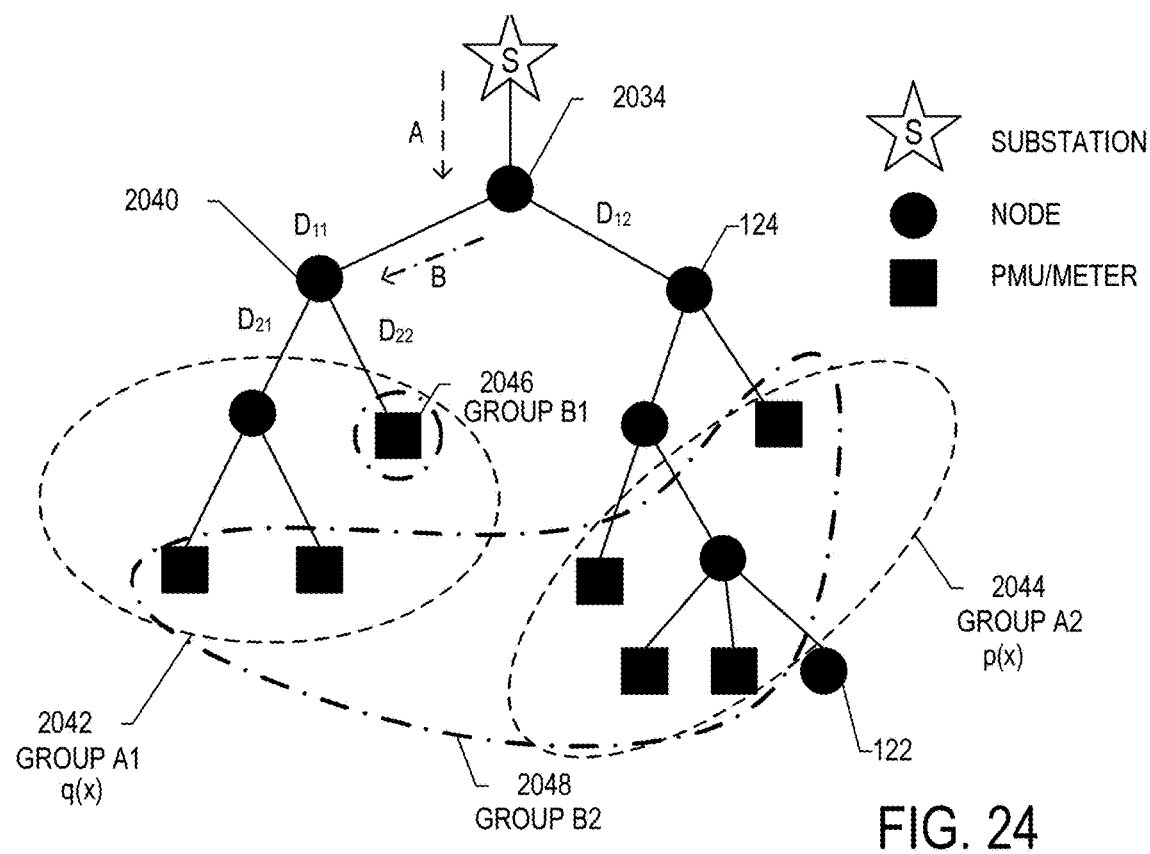

Referring to FIG. 20, an exemplary simulation algorithm 1000 to test various embodiments of the floating neutral detection and localization system 1100 is shown. As shown, forward and backward sweep load calculations using phase decoupled data may be used. By way of example, during a backward sweep analysis the system 1100 calculates branch currents with voltage data collected from a terminal node 122, as shown in FIGS. 23-24 and moving "backwards" towards a reference node or root node 124. The branch currents back to the load buses are calculated using the equation: I=(s/v). Conversely, a forward sweep analysis, the system 1100 determines and updates voltage drops across nodes traveling from the reference node or root node 124 having a known voltage to the terminal node(s) 122. In one embodiment, the branch currents obtained during the backward sweep analysis may also be used for the forward sweep analysis.

Figure 21:
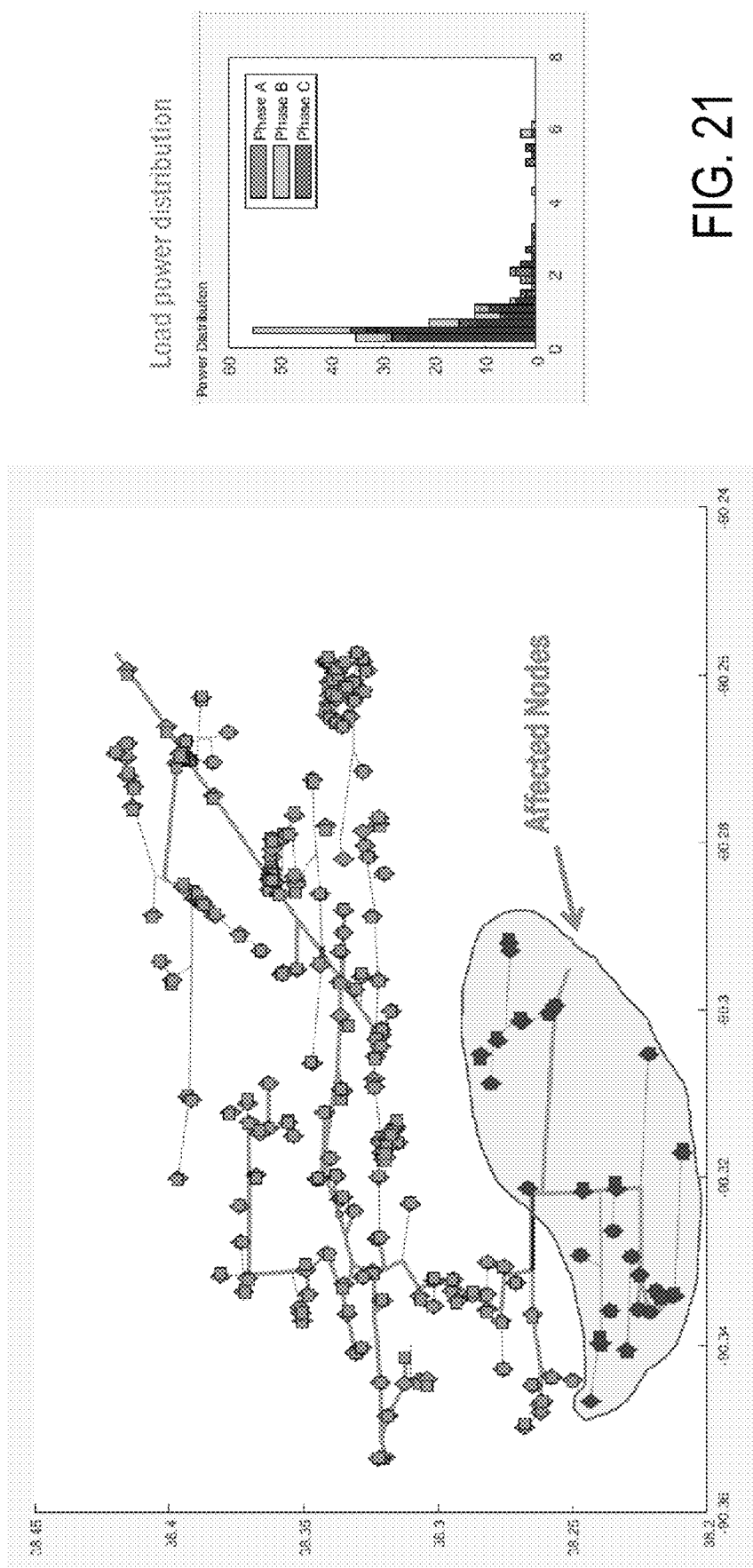
FIG. 21 includes a graph and chart showing simulated nodes of a distributed power network that may be affected by a simulated floating neutral condition and detected by one embodiment of the floating neutral detection and localization system.

At 1002, data from the transmission lines, such as lines 500-506 and nodes 120-124 is received and a flat voltage profile or value is assigned or estimated for all terminal nodes at step 1004. A backward sweep analysis is performed at 1006, where the processor 116 receives data from synchronizers 108 along a path from the terminal node 122 to the root node 124 and updates the current values for each branch 126. A forward sweep is performed at 1008, data from simulated synchronizers 108 along a path from the root node 124 to the terminal node 122 and updates the voltage values for each node 120. At 1010, a determination is made whether the power flow voltage calculations from the backward sweep and the forward sweep converge. If the results converge, the processes are halted 1012. If the results do not converge, the backwards and forward sweeps are repeated 1014. FIG. 21 includes a graph and chart showing simulated nodes 120-124 that are affected by a simulated floating neutral condition.

Figure 22:
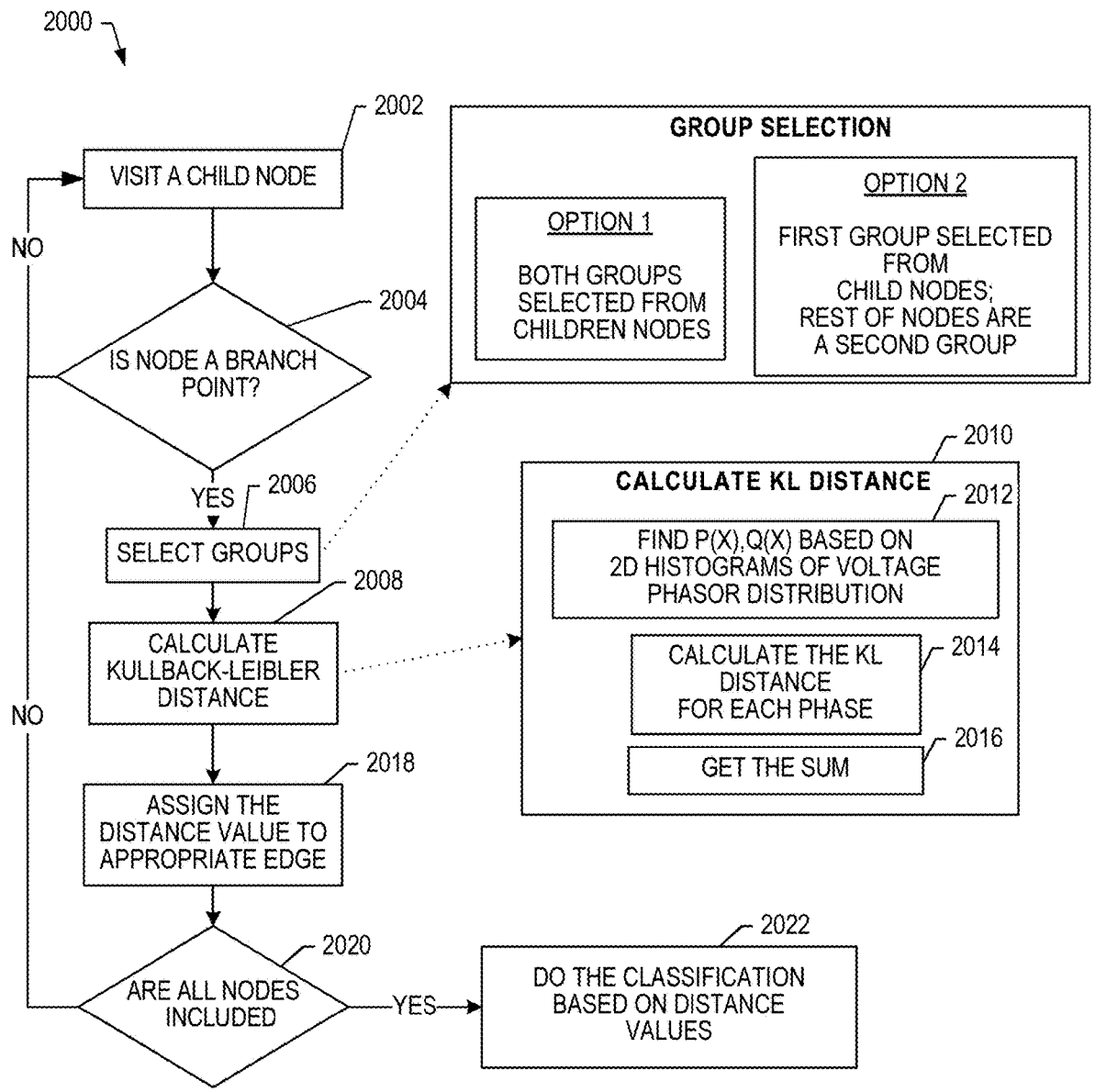
FIG. 22 is a flowchart illustrating one exemplary embodiment of a method for the statistical classification of phasor data to identify and locate a floating neutral fault conditions according to one embodiment of the floating neutral detection and localization system.

Referring to FIGS. 22-24, an exemplary algorithm 2000 stored in a non-transitory, tangible medium such as memory device 118 may be executed by one or more processors 116 for the statistical classification of phasor data to identify and locate a floating neutral fault. Starting at the substation 108, phasor data is collected by synchronizer 108 from a meter 106 associated with a first-level or proximal-level child node at step 2002. At step 2004, it is determined if the first child node is a branch point to other nodes. If the first child node is not a branch point, then the algorithm returns to step 2002 to collect data from another first-level or proximal-level child node. If, however, the first child node is a branch point then the subsequent nodes are grouped together at step 2006. In one embodiment, as shown in FIG. 23, the groups A1 and A2 2030 and 2032, respectively, are formed from synchronizers/meters associated with all subsequent child nodes of parent branch node 2034 in each respective branch for a first level analysis "A". Similarly, for a subsequent "lower" level analysis "B", the groups B1 and B2 2036 and 2038, respectively, are formed from subsequent child nodes of the parent branching node 2040.

In another embodiment, as shown in FIG. 24, the group A1 2042 is formed from synchronizers/meters associated with the subsequent child nodes of the first level branching node 2034, while all other nodes, regardless of level are grouped into a second group A2 2044 for a first level analysis "A" Similarly, for a subsequent "lower" level analysis "B", the group B1 2046 is formed from synchronizers/meters associated with the subsequent child nodes of the second level branching node 2040, while all other nodes, regardless of level are grouped into a second group B2 2048.

After grouping, the Kullback-Leibler ("KL") distance for each group is calculated at step 2008. In one embodiment, calculating the KL distance at step 2008 further includes the execution of a sub-algorithm 2010. The sub-algorithm 2012 includes first finding the P(x),Q(x) values based on a 2-D histograms of the voltage phasor distribution at step 2012. Next the KL distance for each phase is calculated at step 2014 by Equation 26:

$$D_{k1}(p(x)\|q(x)) = \sum_{x \in X} p(x) \ln \frac{p(x)}{q(x)}; \quad (26),$$

and then the sum of the distances for each phase is determined at step 2016. The algorithm 2000 continues at step 2018 to assign the distance value calculated at 2008 to the appropriate phasor edge. At 2020, it is determined if all nodes have been included. If not, the algorithm returns to 2002. Conversely, if all nodes have been accounted for, then the algorithm classifies each node as being in a healthy condition or fault condition at step 2022.

Figure 25:
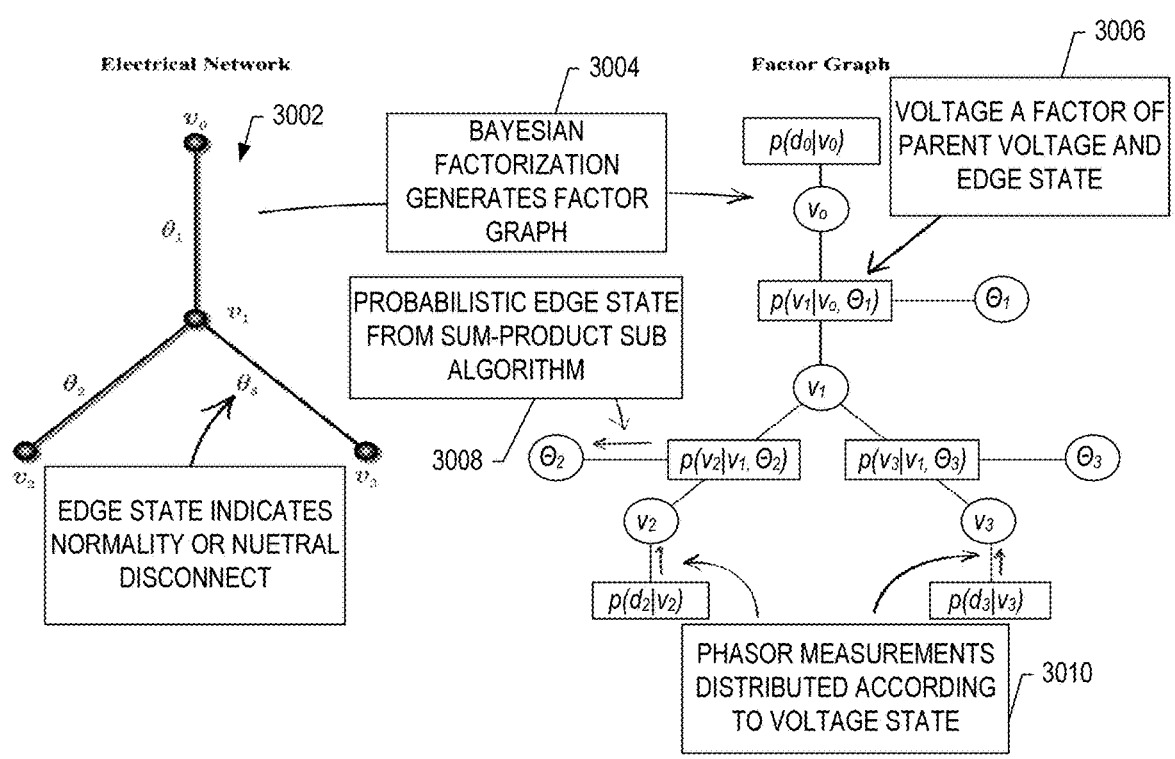
FIG. 25 is flowchart illustrating one exemplary embodiment of a method for message passing to identify and locate a floating neutral fault conditions according to one embodiment of the floating neutral detection and localization system.

With reference to FIG. 25, an exemplary algorithm 3000 stored in a non-transitory, tangible medium such as memory device 118 may be executed by one or more processors 116 for a message passing method to identify and locate floating neutral faults. Starting from a simplified node network at step 3002, a Bayesian factorization is performed to provide a factor graph at step 3004. Voltage values for each node are calculated as a function of a parent voltage and the edge state, as shown at step 3006. As indicated, the edge state may indicate a normal or neutral disconnect condition. At step 3008, the probabilistic edge state for each branch is calculated by executing a sum-product sub-algorithm. The phasor measurements are then distributed to the various nodes according to their voltage states, at step 3010.

Figure 26:
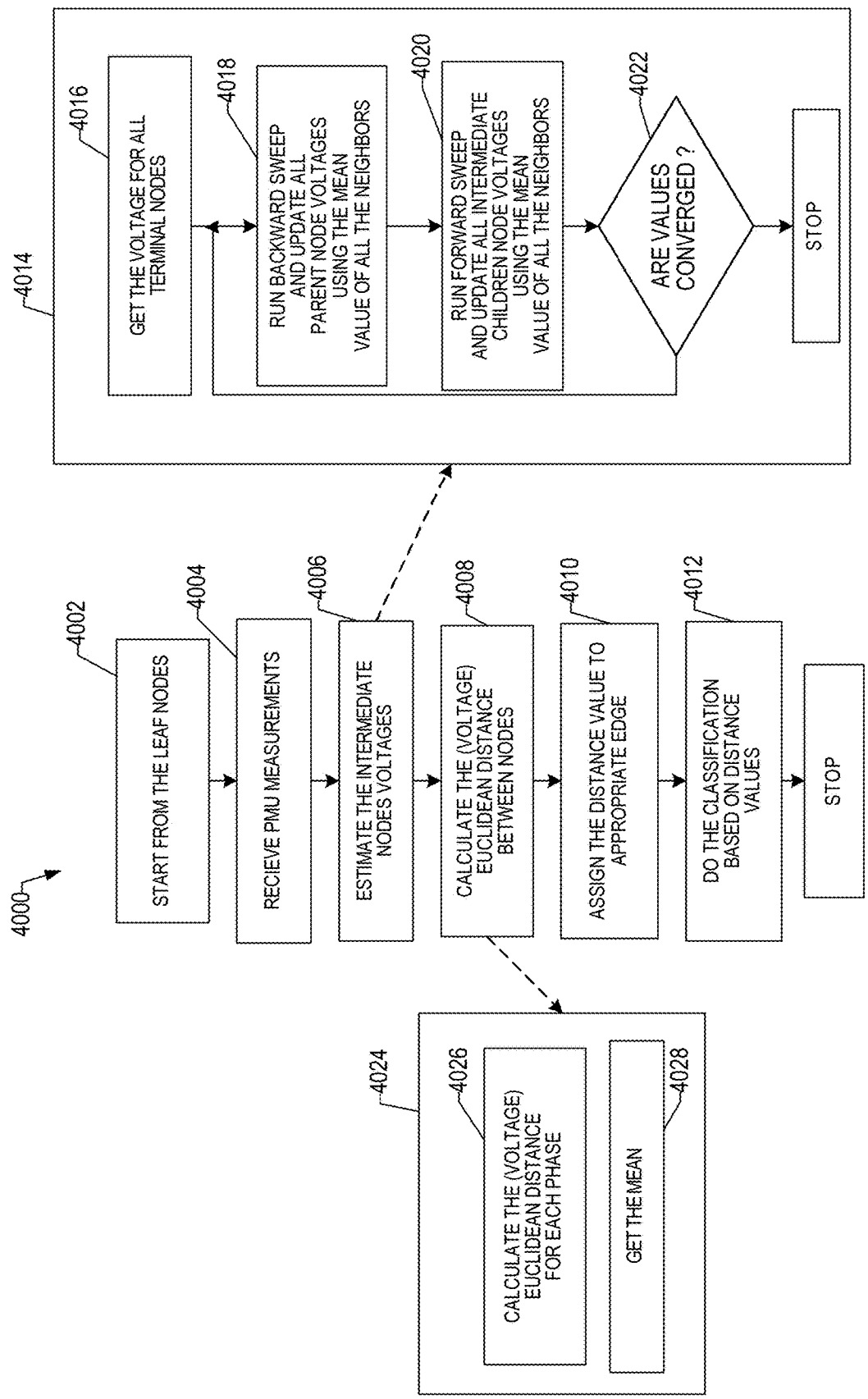
FIG. 26 is a flowchart illustrating one exemplary embodiment of a method for voltage based classification to identify and locate a floating neutral fault conditions according to one embodiment of the floating neutral detection and localization system.

Referring to FIG. 26, an exemplary algorithm 4000 stored in a non-transitory, tangible medium such as memory device 118 may be executed by one or more processors 116 for the voltage based classification of phasor data to identify and locate a floating neutral fault. Starting from a leaf node 120, at step 4002, measurement data from the synchronizer 108 is received at step 4004. Estimates for the voltages at intermediate 124, or both are provided at 4006. Next the Euclidean distance (voltage) between the nodes is calculated at step 4008 and the distances are applied to the appropriate edge at step 4010. Last, the algorithm classifies each node as being in a healthy condition or fault condition at step 4012.

In one embodiment, the step 4006 of estimating the intermediate node voltages further includes the execution of a forward/backward sweeping sub-algorithm 4014 that is similar to the simulation test algorithm 1000 shown in FIG. 20. In particular the sub-algorithm, 4014 includes the steps of collecting voltage values for the terminal nodes 122 relative to the intermediate nodes 120 being analyzed at 4016, running a backward sweep to update parent voltage values at 4018, running a forward sweep to update intermediate child node voltages at 4020 and determining if the values converge at 4022. If the values do not converge, backwards and forwards sweeps of stages 4018 and 4020, respectively, are repeated until convergence is obtained.

In one embodiment, calculating the Euclidean distance (voltage) between the nodes of the step 4008. May further include the execution of sub-algorithm 4024 that includes calculating the Euclidean distance (voltage) for each phase and determining the mean Euclidean distances at steps, 4026 and 4028, respectively.

Figure 27:
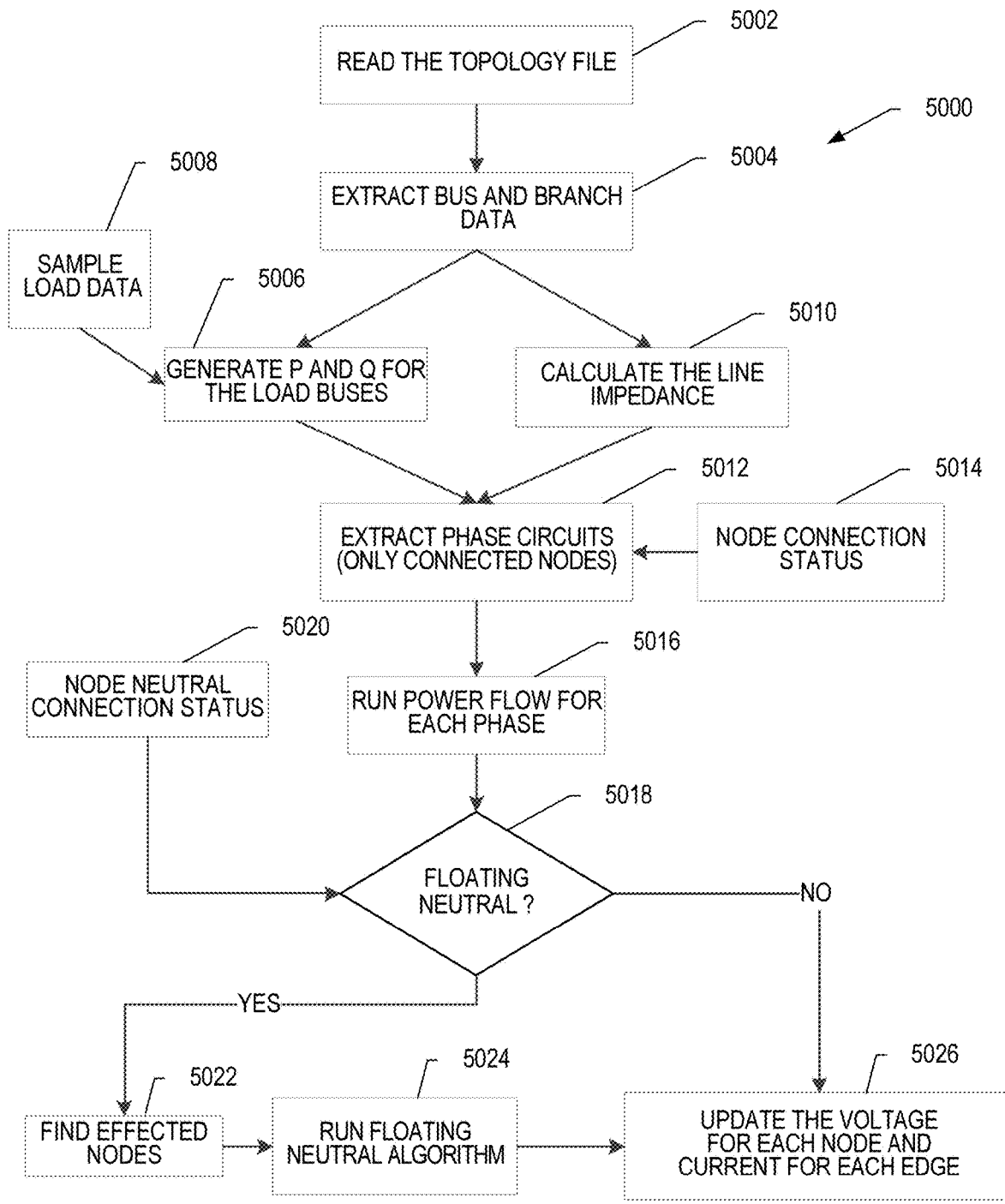
FIG. 27 is a flowchart illustrating a simulation method used to test various embodiments of the floating neutral detection and localization system.

Referring now to FIG. 27, a flowchart of a simulation testing method 5000 for testing various embodiments of the floating neutral detection and localization system 1100 is shown. As shown, topology data for the distributed power network 104, 105 is received or otherwise retrieved from a database or other non-transitory, tangible medium such as memory device 118 and processed by one or more processors 116 at step 5002. At 5004 data related to the load bus(es) and branches of the network are extracted from the topology data. P and Q values (e.g. real power and reactive power) are generated for the load buses at step 5006. In one aspect generating the P and Q values may further include receiving or sampling load data from the bus(es) themselves, as indicated by 5008. At step 5010, line impedance values are calculated. Based, at least in part, on the load bus(es) P and Q values and the calculated impedance values, phase circuits are extracted at 5012 in conjunction with receiving node connection status data as indicated by 5014. A Power flow determination is made for each phase at step 5016. As a result, a determination is made at step 5018 if any floating neutral conditions are potentially present. The determination further takes into account any none neutral node connections as indicated by 5020. If a floating neutral condition is identified at step 5018 then the affected nodes are identified at step 5022 and one or more floating neutral algorithm 2000, 3000, and 4000 are executed at step 5024. After executing one or more algorithms 2000, 3000, and 4000, the voltage for each node and the current for the associated edges are updated at step 5026. Similarly, if no floating neutrals are identified at step 5018, the voltage for each node and the current for the associated edges are updated at step 5026.

The floating neutral fault detection system 1100 and associated algorithms may be used in conjunction with sensor networks, such as for Advanced Metering Infrastructure or "AMI" applications). The floating neutral fault detection may also utilize a synchronizer to cooperatively monitor physical or environmental conditions at different locations, such as, e.g., energy/power consumption, resource consumption, etc. Typically, size and cost constraints on sensor nodes result in corresponding constraints on resources such as energy, memory, computational power, and bandwidth.

One of skill in the art will understand that any number of nodes, devices, links, etc., as well as any different (and suitable) type of nodes, devices, links, etc., may be present in the network, and that the view shown herein is for simplicity and is not meant to limit the scope of the embodiments herein. In fact, those skilled in the art will appreciate that countless arrangements of power grid components and communicating devices may be established.

As described herein, some or all of the various device components can be digital components comprising software or firmware stored in a non-transitory, tangle medium such as a memory device and executed by one or more processors.

The Abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored on one or more tangible, non-transitory storage media, and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers, and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives, and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

The invention claimed is:

1. A method detecting floating neutral faults using a floating neutral detection and localization system, the system comprising a phase synchronizer and a computing device having a memory and a processor; the method comprising:

at the processor:

polling a first node in a distributed power network for first phasor data;

determining if the first node is a branch point;

wherein if the first node is not a branch point, then polling a second node for second phasor data, wherein the second node is a sequential to the first node;

wherein if the first node is a branch point, then grouping child nodes of the first node into at least a first child group and a second child group;

calculating a Kullback-Leibler distance for each phase within each of the child groups; assigning a total distance value to each of the phases of the child groups;

determining if each node in the distributed power network has been polled for phasor data;

wherein if any other node in the distributed power network has not been polled, polling a next sequential node; and;

wherein if all nodes have been polled, classifying each edge as being in a healthy condition or a fault condition based on a total Kullback-Leibler distance; and, interrupting power flow in at least one circuit of the distributed power network in response to the classification of at least one edge of the distributed power system as being in a fault condition.

2. The method of claim 1 wherein at least the first and second child groups are represented in the calculation of the Kullback-Liebler distance as statistical values including $p(x)$ and $q(x)$.

3. The method of claim 1 wherein a first group of the child groups includes all children nodes of the first node and a second child group includes all other nodes at a level lower than the first node in the distributed power network.

4. The method of claim 1 wherein a first group of the child groups includes all children nodes of the first node and a second child group includes all other nodes regardless of location in the distributed power network.

5. The method of claim 1 wherein calculating the Kullback-Leibler distance for each group further comprises:

at the processor:

calculating a $p(x)$ value using a 2D histogram of voltage phasor distribution; and calculating a $q(x)$ value using a 2D histogram of voltage phasor distribution.

6. The method of claim 1 wherein assigning a total distance value to each of the child groups further comprises at the processor, calculating a sum of the Kullback-Leibler distances for each phase.

7. A system for detecting and localizing floating fault conditions in a distributed power network, the system comprising:

a phase synchronizer in communication with a meter within the distributed power network to generate synchronized phasor data; and a computing device having a memory and a processor to:

poll a first node in the distributed power network for first phasor data;

determine if the first node is a branch point; wherein if the first node is not a branch point, then poll a second node for second phasor data, wherein the second node is a sequential to the first node;

wherein if the first node is a branch point, then group child nodes of the first node into at least a first child group and a second child group;

calculate a Kullback-Leibler distance for each phase within each of the child groups;

assign a total distance value to each of the phases of the child groups;

determine if each node in the distributed power network has been polled for phasor data;

wherein if any other node in the distributed power network has not been polled, poll a next sequential node; and;

wherein if all nodes have been polled, classify each edge as being in a healthy condition or a fault condition based on a total Kullback-Leibler distance; and, interrupting power flow in at least one circuit of the distributed power network in response to the classification of at least one edge of the distributed power system as being in a fault condition.

8. A non-transitory computer-readable storage medium, having instructions stored thereon that, when executed by a computing device cause the computing device to perform operations, the operations comprising:

polling a first node in a distributed power network for first phasor data;

determining if the first node is a branch point; wherein if the first node is not a branch point, then polling a second node for second phasor data, wherein the second node is a sequential to the first node;

wherein if the first node is a branch point, then grouping child nodes of the first node into at least a first child group and a second child group;

calculating a Kullback-Leibler distance for each phase within each of the phases of the child groups;

assigning a total distance value to each of the child groups;

determining if each node in the distributed power network has been polled for phasor data;

wherein if any other node in the distributed power network has not been polled, poll a next sequential node; and;

wherein if all nodes have been polled, classifying each edge as being in a healthy condition or a fault condition based on a total Kullback-Leibler distance; and, interrupting power flow in at least one circuit of the distributed power network in response to the classification of at least one edge of the distributed power system as being in a fault condition.

* * * * *